US012560632B2

(12) United States Patent
Yamaguchi et al.

(10) Patent No.: US 12,560,632 B2
(45) Date of Patent: Feb. 24, 2026

(54) STATE ESTIMATION SYSTEM AND STATE ESTIMATION METHOD FOR POWER CONVERSION SEMICONDUCTOR APPARATUS

(71) Applicants: TOSHIBA MITSUBISHI-ELECTRIC INDUSTRIAL SYSTEMS CORPORATION, Chuo-ku (JP); KYUSHU INSTITUTE OF TECHNOLOGY, Kitakyushu (JP)

(72) Inventors: Haruyuki Yamaguchi, Tokyo (JP); Makoto Mukunoki, Tokyo (JP); Masahiko Tsukakoshi, Tokyo (JP); Ichiro Omura, Kitakyushu (JP); Masanori Tsukuda, Kitakyushu (JP); Li Guan, Suzuka (JP); Kazuha Watanabe, Kitakyushu (JP)

(73) Assignees: TMEIC CORPORATION, Chuo-ku (JP); KYUSHU INSTITUTE OF TECHNOLOGY, Kitakyushu (JP)

( * ) Notice: Subject to any disclaimer, the term of this patent is extended or adjusted under 35 U.S.C. 154(b) by 563 days.

(21) Appl. No.: 17/764,786

(22) PCT Filed: Aug. 28, 2020

(86) PCT No.: PCT/JP2020/032604
§ 371 (c)(1),
(2) Date: Mar. 29, 2022

(87) PCT Pub. No.: WO2022/044257
PCT Pub. Date: Mar. 3, 2022

(65) Prior Publication Data
US 2022/0334152 A1 Oct. 20, 2022

(51) Int. Cl.
*G01R 19/10* (2006.01)
*H02M 1/00* (2006.01)
(Continued)

(52) U.S. Cl.
CPC .......... *G01R 19/10* (2013.01); *H02M 1/0009* (2021.05); *H02M 1/08* (2013.01); *H02M 7/53871* (2013.01)

(58) Field of Classification Search
CPC ....... G01R 19/10; G01K 7/01; H02M 1/0009; H02M 1/08
See application file for complete search history.

(56) References Cited

U.S. PATENT DOCUMENTS 5,918,982 A * 7/1999 Nagata ..................... G01K 7/01
374/178
8,103,463 B2 1/2012 Kalgren et al.

FOREIGN PATENT DOCUMENTS

EP 3 379 713 A1 9/2018
JP 2003050257 A * 2/2003
(Continued)

OTHER PUBLICATIONS

Stella et al., "On-line Temperature Estimation of SiC Power MOSFET Modules through On-state Resistance Mapping", In: Energy Conversion Congress Exposition (ECCE), 2017 IEEE, Cincinnati, OH, USA, Oct. 1-5, 2017, pp. 5907-5914 (9 total pages).
(Continued)

*Primary Examiner* — Lam S Nguyen
(74) *Attorney, Agent, or Firm* — Oblon, McClelland, Maier & Neustadt, L.L.P.

(57) ABSTRACT

A state estimation system for a power conversion semiconductor apparatus in an embodiment includes an analysis processing unit and an estimation processing unit. The analysis processing unit projects points indicating a combination of a voltage detection value in first time history data of a voltage between the pair of main terminals detected when the pair of main terminals are forward-biased and when the pair of main terminals are reverse-biased and a current detection value in second time history data of
(Continued)

detection values of both a forward current and a reverse current between the pair of main terminals onto a coordinate plane including a voltage axis and a current axis on the basis of the first time history data and the second time history data in the power conversion semiconductor apparatus including the pair of main terminals and derives a distribution of the projected points on the coordinate plane. An estimation processing unit estimates a state of the power conversion semiconductor apparatus on the basis of a distribution of the projected points.

22 Claims, 22 Drawing Sheets

(51) Int. Cl.
H02M 1/08          (2006.01)
H02M 7/5387          (2007.01)

(56)                    References Cited

FOREIGN PATENT DOCUMENTS

JP          2014-236538  A      12/2014
KR          20050011030  A   *   1/2005

OTHER PUBLICATIONS

Indian Office Action issued on Jul. 28, 2023 in Indian Patent Application No. 202217018457, 6 pages.

* cited by examiner

| TIME HISTORY IDENTIFIER | VOLTAGE VALUE DATA | CURRENT VALUE DATA | TEMPERATURE DETECTION VALUE DATA |
|---|---|---|---|
| . . . | . . . | . . . | . . . |
| . . . | . . . | . . . | . . . |
| . . . | . . . | . . . | . . . |

STATE ESTIMATION SYSTEM AND STATE ESTIMATION METHOD FOR POWER CONVERSION SEMICONDUCTOR APPARATUS

TECHNICAL FIELD

An embodiment of the present invention relates to a state estimation system and a state estimation method for a power conversion semiconductor apparatus.

BACKGROUND ART

If the deterioration of a power conversion semiconductor apparatus (an electronic valve device) used in a power conversion apparatus (a power conversion system) progresses and leads to a failure, the power conversion apparatus may stop. To prevent this, it is desired to be able to accurately detect the state associated with the progress of deterioration of a power conversion semiconductor apparatus.

It has been difficult to detect that the deterioration of a power conversion semiconductor apparatus is progressing within a period in which a power conversion apparatus converts electric power (an online period) simply by a method for detecting a state of the power conversion semiconductor apparatus during a period in which the power conversion apparatus is stopped for periodic maintenance and the like (an offline period).

CITATION LIST

Non-Patent Document

[Non-Patent Document 1]
F. Stella, G. Pellegrino, E. Armando and D. Dapra, "On-line temperature estimation of SiC power MOSFET modules through on-state resistance mapping," 2017 IEEE Energy Conversion Congress and Exposition (ECCE), Cincinnati, Ohio, 2017, pp. 5907 to 5914.

SUMMARY OF INVENTION

Technical Problem

An object of the present invention is to provide a state estimation system and a state estimation method for a power conversion semiconductor apparatus which enables analysis of a state associated with the progress of deterioration of the power conversion semiconductor apparatus within a period in which electric power is converted.

Solution to Problem

A state estimation system for a power conversion semiconductor apparatus in an embodiment includes an analysis processing unit and an estimation processing unit. The analysis processing unit projects points indicating a combination of a voltage detection value in first time history data of a voltage between a pair of main terminals detected when the pair of main terminals are forward-biased and when the pair of main terminals are reverse-biased and a current detection value in second time history data of detection values of both a forward current and a reverse current between the pair of main terminals onto a coordinate plane including a voltage axis and a current axis on the basis of the first time history data and the second time history data in the power conversion semiconductor apparatus including the pair of main terminals and derives a distribution of the projected points on the coordinate plane. The estimation processing unit estimates a state of the power conversion semiconductor apparatus on the basis of a distribution of the projected points.

BRIEF DESCRIPTION OF DRAWINGS

Figure 1A:
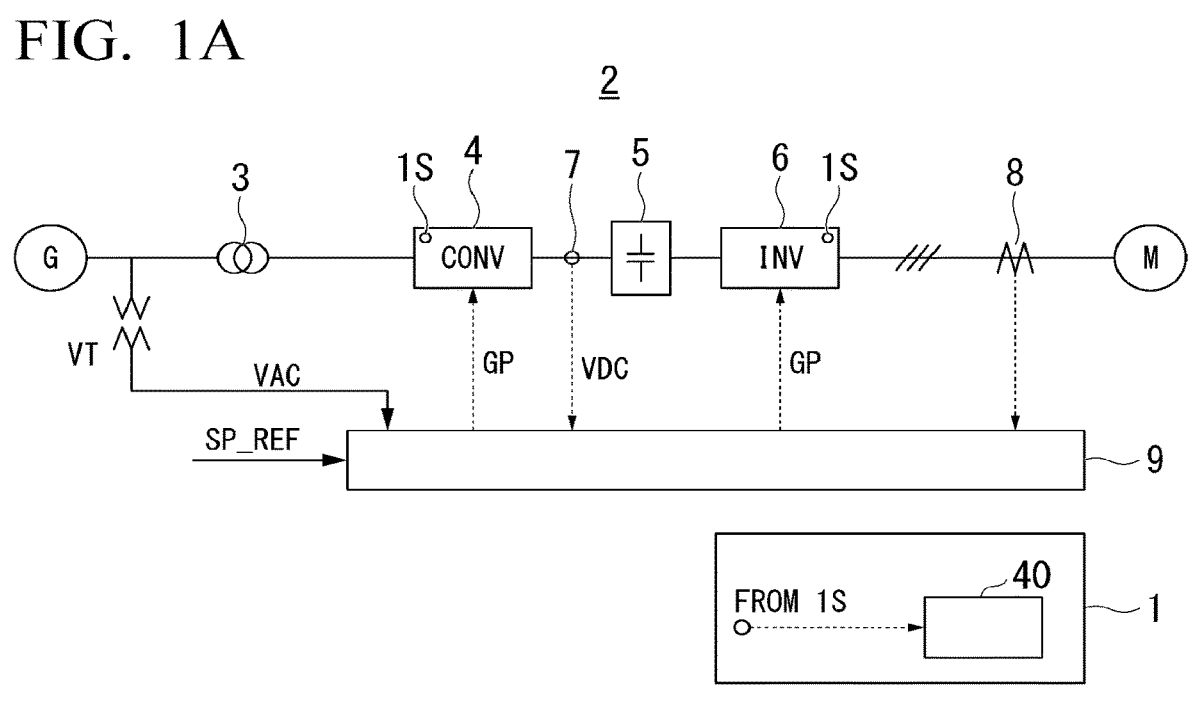

FIG. 1A is a diagram illustrating a constitution of a power conversion system to which a state estimation system for a power conversion semiconductor apparatus in a first embodiment is applied.

FIG. 2B is a diagram for explaining an example of a detection value data table TBL in the first embodiment.

FIG. 3C is a diagram illustrating a constitution of a voltage detection circuit in a second modification.

FIG. 4A is a diagram for explaining a state change of the voltage detection circuit in the first embodiment.

FIG. 5C is a diagram for explaining a procedure for deriving a saturation voltage characteristic using a voltage and a collector current Ic between the main terminals of the IGBT in FIG. 5A.

DESCRIPTION OF EMBODIMENTS

Figure 1B:
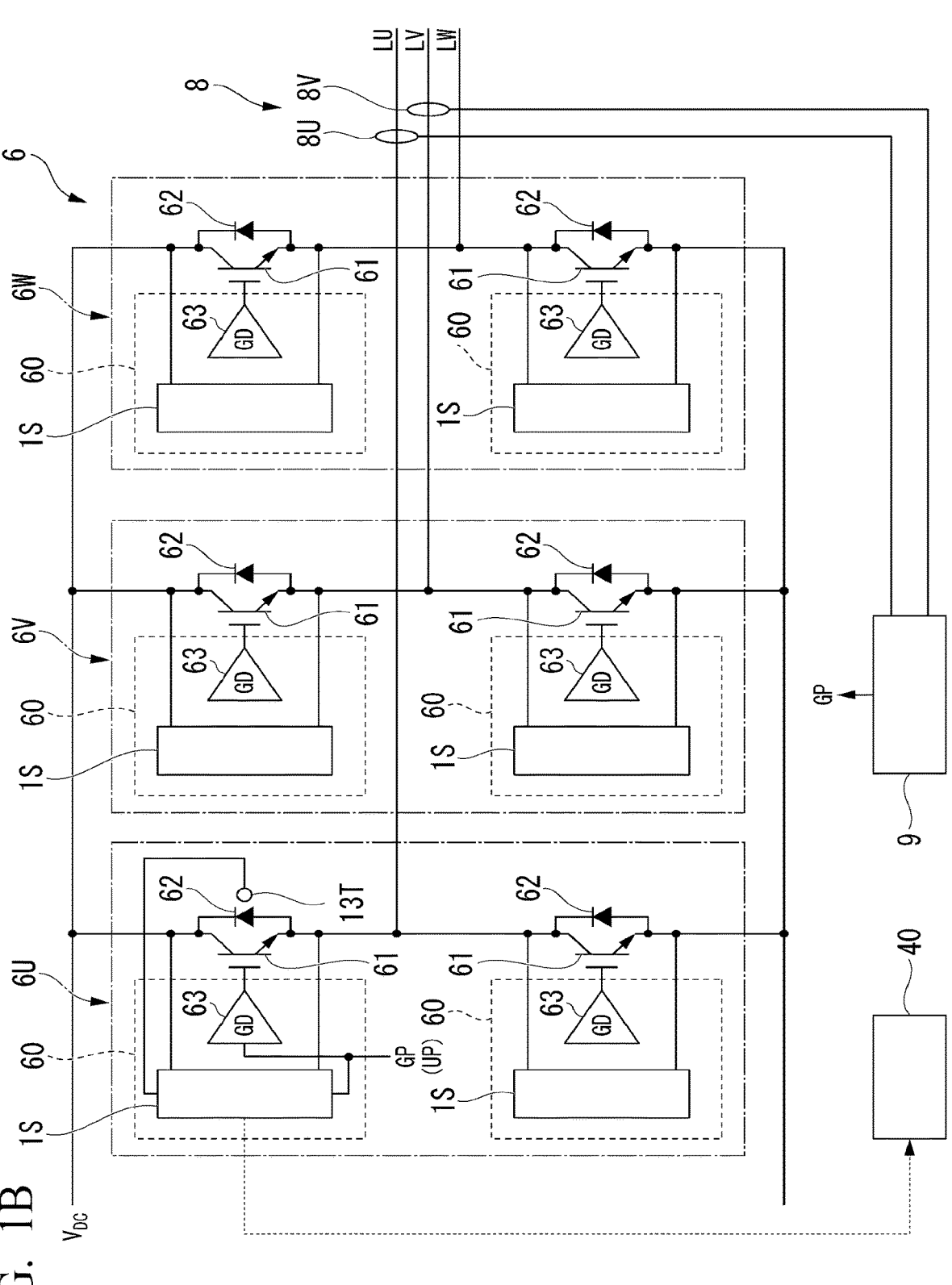
FIG. 1B is a diagram illustrating an inverter to which a data collection unit in the first embodiment is applied.

A state estimation system and a state estimation method for a power conversion semiconductor apparatus in an embodiment will be described below with reference to the drawings.

The "power conversion semiconductor apparatus" in the following description is an example of an electronic valve device. For example, the "power conversion semiconductor apparatus" may include one or more electronic valve devices and include, for example, an electronic valve device of either one or both of a controllable valve device and a non-controllable valve device. Examples of the power conversion semiconductor apparatus includes a power conversion semiconductor apparatus which includes a controllable valve device and does not include a non-controllable valve device and a power conversion semiconductor apparatus which includes a controllable valve device and a non-controllable valve device connected in antiparallel between a pair of main terminals thereof. In this case, the non-controllable valve device may be separate from the controllable valve device or may be configured as a body diode. A more specific example of the power conversion semiconductor apparatus includes any of an insulated gate bipolar transistor (IGBT) having freewheeling diodes connected in antiparallel therein and a metal-oxide-semiconductor field-effect transistor (MOSFET). The present invention is not limited to application to MOSFETs having freewheeling diodes connected in antiparallel.

Also, constituent elements having the same or similar functions will be denoted by the same reference symbols. Furthermore, duplicate description of these constituent elements will be omitted in some cases. Being electrically connected may be simply referred to using the term "connected."

In the following description, the expression "in operation" means an operating state in which a power conversion system is converting electric power. In this operating state, the power conversion semiconductor apparatus is controlled such that it is repeatedly turned on/off over a prescribed period within an online period.

First, a power conversion system 2 to which a state estimation system 1 for the power conversion semiconductor apparatus in the embodiment is applied will be described. FIG. 1A is a diagram illustrating a constitution of the power conversion system 2 to which the state estimation system 1 for the power conversion semiconductor apparatus in the embodiment is applied.

The power conversion system 2 includes, for example, a transformer 3, a converter 4, a capacitor 5, an inverter 6, a DC voltage sensor 7, a current sensor 8, and a control unit 9.

The transformer 3 converts a voltage of alternating current (AC) power supplied from an AC power supply G (referred to as a "power supply voltage") into a prescribed voltage. An instrument transformer VT is provided on a primary side of the transformer 3 and the control unit 9 which will be described later may use an input voltage feedback VAC for control thereof.

The converter 4 rectifies AC power supplied from the AC power supply G, for example, through control and outputs a desired voltage (a direct current (DC) voltage) between a negative electrode N and a positive electrode P of a DC link connected to an output. The converter 4 may be a diode converter (a rectifier) configured to convert electric power without control. The capacitor 5 smooths a voltage between the negative electrode N and the positive electrode P of the DC link. The converter 4 and the capacitor 5 are examples of a DC power supply. The inverter 6 converts DC power supplied via the DC link into AC power through control and the output AC power. The converter 4 and the inverter 6 each include a power conversion semiconductor apparatus therein.

An electric motor M is a load of the power conversion system 2. For example, the electric motor M may have three windings connected in a star type (a Y type) and three-phase AC power may be supplied from the inverter 6 such that it is driven accordingly.

For example, the DC voltage sensor 7 detects a voltage applied to the DC link and outputs a DC voltage feedback VDC corresponding thereto. The current sensor 8 detects a phase current flowing through each phase of a multi-phase alternating current of the inverter 6 on an output side and outputs a current feedback corresponding thereto. A transformer CT is an example of the current sensor 8. The current sensor 8 may be a Hall element.

The control unit 9 sends a gate pulse GP to the converter 4 on the basis of, for example, a DC voltage feedback VDC and controls an amount of power conversion using the converter 4. The control unit 9 sends the gate pulse GP to the inverter 6 on the basis of, for example, a speed reference SP_REF, a current feedback output from the current sensor 8, or the like and controls an amount of power conversion using the inverter 6.

The state estimation system 1 will be described below.

The state estimation system 1 includes a data collection unit 1S and an analysis processing apparatus 40.

The data collection unit 1S is provided, for example, in association with one or both of the converter 4 and the inverter 6. The data collection unit 1S detects a state of the power conversion semiconductor apparatus constituting the converter 4 and the inverter 6.

The analysis processing apparatus 40 estimates a state associated with the progress of deterioration of the power conversion semiconductor apparatus on the basis of a detection result using the data collection unit 1S.

In the following description, as a representative example, a case in which a state of the power conversion semiconductor apparatus forming the inverter 6 is estimated will be described. The same applies to the case of the converter 4 which replaces this.

FIG. 1B is a diagram illustrating a constitution of the inverter 6 to which the data collection unit 1S in the embodiment is applied.

The inverter 6 includes, for example, a leg 6U, a leg 6V, and a leg 6W, is composed of a three-phase full bridge type, and generates three-phase AC power through control. Each of the legs which are the leg 6U, the leg 6V, and the leg 6W includes a plurality of power conversion semiconductor apparatuses. For example, there may be a plurality of power conversion semiconductor apparatuses of the same type. Any type of power conversion semiconductor apparatus may be utilized. The power conversion semiconductor apparatus may be, for example, a switching device such as an IGBT or a MOSFET. A freewheeling diode 62 connected in antiparallel between a pair of main terminals of the IGBT 61 is provided in the IGBT 61 illustrated in FIG. 1B and is formed so that a regenerative operation is possible.

A U-phase winding for the electric motor M is connected to an output terminal of the leg 6U via a connection wire LU. The current sensor 8U is provided on the connection wire LU. The current sensor 8U detects a current flowing through the connection wire LU and the U-phase winding for the electric motor M.

A V-phase winding for the electric motor M is connected to an output terminal of the leg 6V via a connection wire LV. The current sensor 8V is provided on the connection wire LV. The current sensor 8V detects a current flowing through the connection wire LV and the V-phase winding for the electric motor M. Similarly, a W-phase winding for the electric motor M is connected to an output terminal of the leg 6W via a connection wire LW.

One of gate drive circuit units 60 which are independently formed is provided on each of power conversion semiconductor apparatus forming the inverter 6. The data collection unit 1S is provided in each of the gate drive circuit units 60.

Figure 1C:
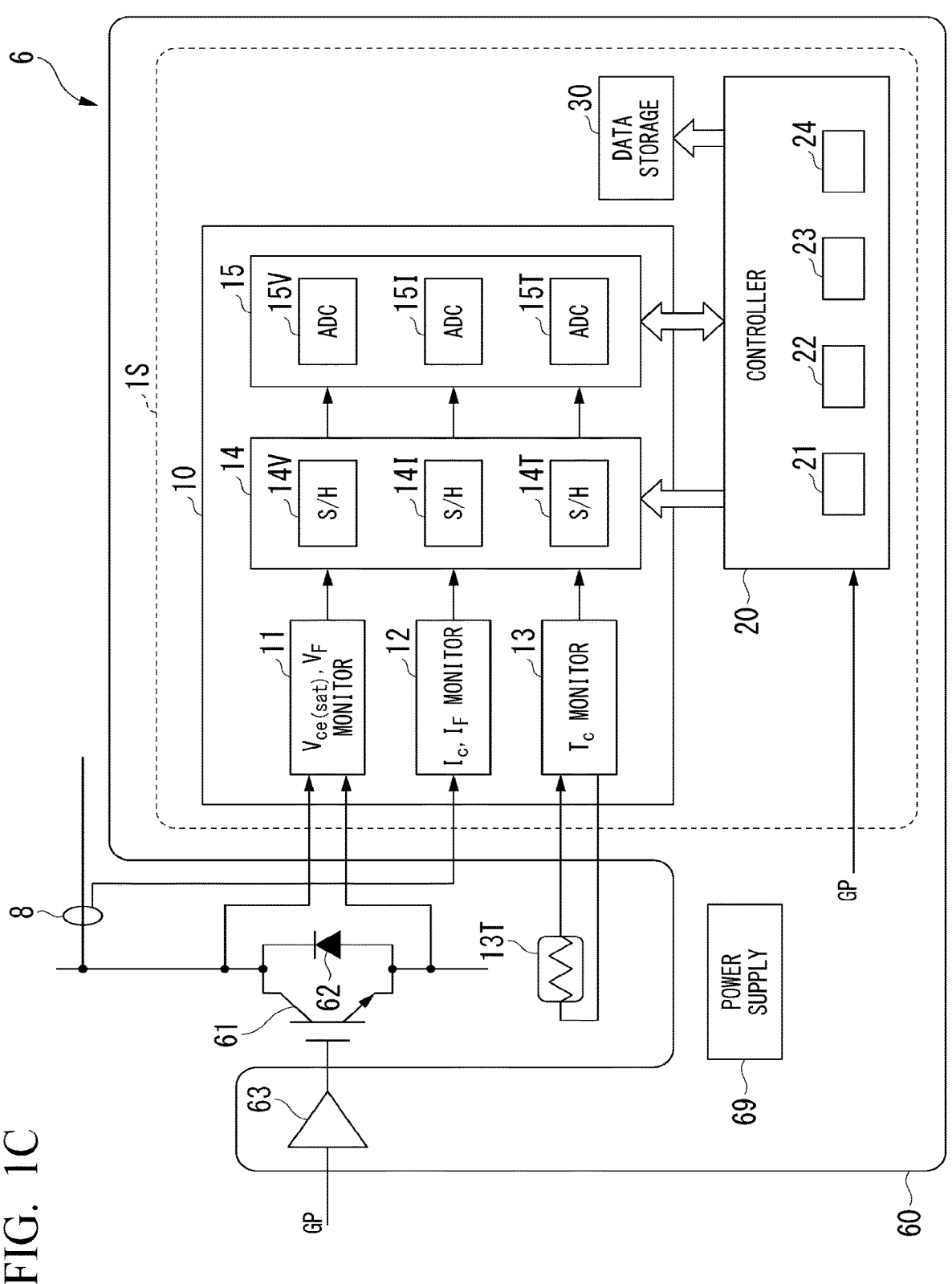
FIG. 1C is a diagram illustrating a constitution of a gate drive circuit unit in the first embodiment.

An example of the gate drive circuit unit 60 will be described with reference to FIG. 1C. FIG. 1C is a diagram illustrating a constitution of the gate drive circuit unit 60 in the embodiment.

The gate drive circuit unit 60 includes a gate driver (a GD or a gate drive circuit) 63, a power supply 69, and the data collection unit 1S.

The gate driver 63 is an example of the gate drive circuit. An input of the gate driver 63 is connected to the control unit 9 through, for example, an optical fiber or the like and an output of the gate driver 63 is connected to a gate terminal (a control terminal) of the IGBT 61. The gate driver 63 generates a gate signal used for driving the IGBT 61 on the basis of the gate pulse GP supplied from the control unit 9 and supplies the generated gate signal to the gate terminal of the IGBT 61 to switch the IGBT 61.

The power supply 69 generates DC power for driving each part in the gate drive circuit unit 60 on the basis of electric power supplied from outside of the gate drive circuit unit 60. The DC power generated by the power supply 69 is supplied to the gate driver 63 and the data collection unit 1S. A voltage of the DC power generated using the power supply 69 may be appropriately determined depending on a constitution of the inverter 6.

The data collection unit 1S includes, for example, a voltage detection circuit 11 (FIG. 1C includes "Vce (sat), $V_F$ MONITOR" shown therein), a current detection circuit 12 (FIG. 1C includes "Ic, $I_F$ MONITOR" shown therein), a temperature detection circuit 13 (FIG. 1C includes "Tc MONITOR" shown therein), an SH circuit 14 (FIG. 1C includes "sample and hold (S/H)" shown therein), an AD conversion circuit 15 (FIG. 1C includes "analog to digital converter (ADC)" shown therein), a controller 20 (FIG. 1C includes "CONTROLLER" shown therein), and a storage unit 30 (FIG. 1C includes "DATA STORAGE" shown therein).

The voltage detection circuit 11 detects a voltage between the main terminals of the IGBT 61 and outputs the detection result as an analog signal. The voltage between the main terminals includes a saturation voltage Vce (sat) of the IGBT 61 and a forward voltage $V_F$ of the freewheeling diode 62 depending on the conditions at the time of measurement. The details of the voltage detection circuit 11 will be given later.

The current detection circuit 12 outputs the detection result of a collector current Ic of the IGBT 61 and a current $I_F$ of the freewheeling diode 62 on the basis of an output value of the current sensor 8.

The temperature detection circuit 13 outputs, as an analog signal, the detection result of a temperature Tc based on an output value of a temperature sensor 13T. The temperature sensor 13T is, for example, a thermistor and is disposed to detect the temperature Tc of the IGBT 61 and the freewheeling diode 62.

The SH circuit 14 is an example of a sample and hold circuit and retains a value of an analog signal in accordance with a timing of a control signal. For example, the SH circuit 14 includes a voltage value SH circuit 14V, a current value SH circuit 14I, and a temperature detection value SH circuit 14T. The voltage value SH circuit 14V retains an output value of the voltage detection circuit 11. The current value SH circuit 14I retains an output value of the current detection circuit 12. The temperature detection value SH circuit 14T retains an output value of the temperature detection circuit 13.

The AD conversion circuit 15 is an example of an analog to digital converter (ADC) circuit and converts an analog signal which is input into a digital signal having a prescribed resolution and outputs the converted digital signal. For example, the AD conversion circuit 15 includes a voltage value ADC 15V, a current value ADC 15I, and a temperature detection value ADC 15T. The AD conversion circuit 15 may include a plurality of conversion units which are independently configured for each analog signal to be input as described above. The voltage value ADC 15V converts the output value of the voltage detection circuit 11 retained using the voltage value SH circuit 14V. The current value ADC 15I converts the output value of the current detection circuit 12 retained using the current value SH circuit 14I. The temperature detection value ADC 15T converts the output value of the temperature detection circuit 13 retained using the temperature detection value SH circuit 14T.

The voltage detection circuit 11, the voltage value SH circuit 14V, and the voltage value ADC 15V are examples of a first data collection unit. The voltage detection circuit 11, the voltage value SH circuit 14V, and the voltage value ADC 15V collect first time history data including the saturation voltage Vce (sat) of the IGBT 61 and the forward voltage $V_F$ of the freewheeling diode 62 as first time series data indicating the detection values of the voltages. The current detection circuit 12, the current value SH circuit 14I, and the current value ADC 15I are examples of a second data collection unit. The current detection circuit 12, the current value SH circuit 14I, and the current value ADC 15I collect second time history data using the output value of the current sensor 8 (a current including the collector current Ic of the IGBT 61 and the current $I_F$ of the freewheeling diode 62) as second time series data indicating the detection values of the currents.

Although the parts constituting the SH circuit 14 and the AD conversion circuit are illustrated as being separate from each other, this does not limit appropriate selection of components which are integrated therewith.

The controller 20 includes an AD conversion control unit 21, a synchronization control unit 22, a data storage processing unit 23, and a communication processing unit 24.

The AD conversion control unit 21 controls the SH circuit 14 and the AD conversion circuit 15 at a prescribed timing to cause the SH circuit 14 to retain analog values of the saturation voltage Vce (sat) of the IGBT 61, the forward voltage $V_F$ of the freewheeling diode 62, the collector current Ic of the IGBT 61, the current $I_F$ of the freewheeling diode 62, and the temperatures Tc of the IGBT 61 and the freewheeling diode 62 and cause the AD conversion circuit 15 to generate digital values.

The synchronization control unit 22 generates a timing signal for securing the synchronization of conversion using the AD conversion control unit 21 and controls sampling using the SH circuit 14.

The data storage processing unit 23 collects time history data of the digital value generated using the AD conversion circuit 15 and writes the time history data in the storage unit 30 as time series data.

The communication processing unit 24 provides a notification of various data written in the storage unit 30 in accordance with a request from the analysis processing apparatus 40.

Figure 2A:
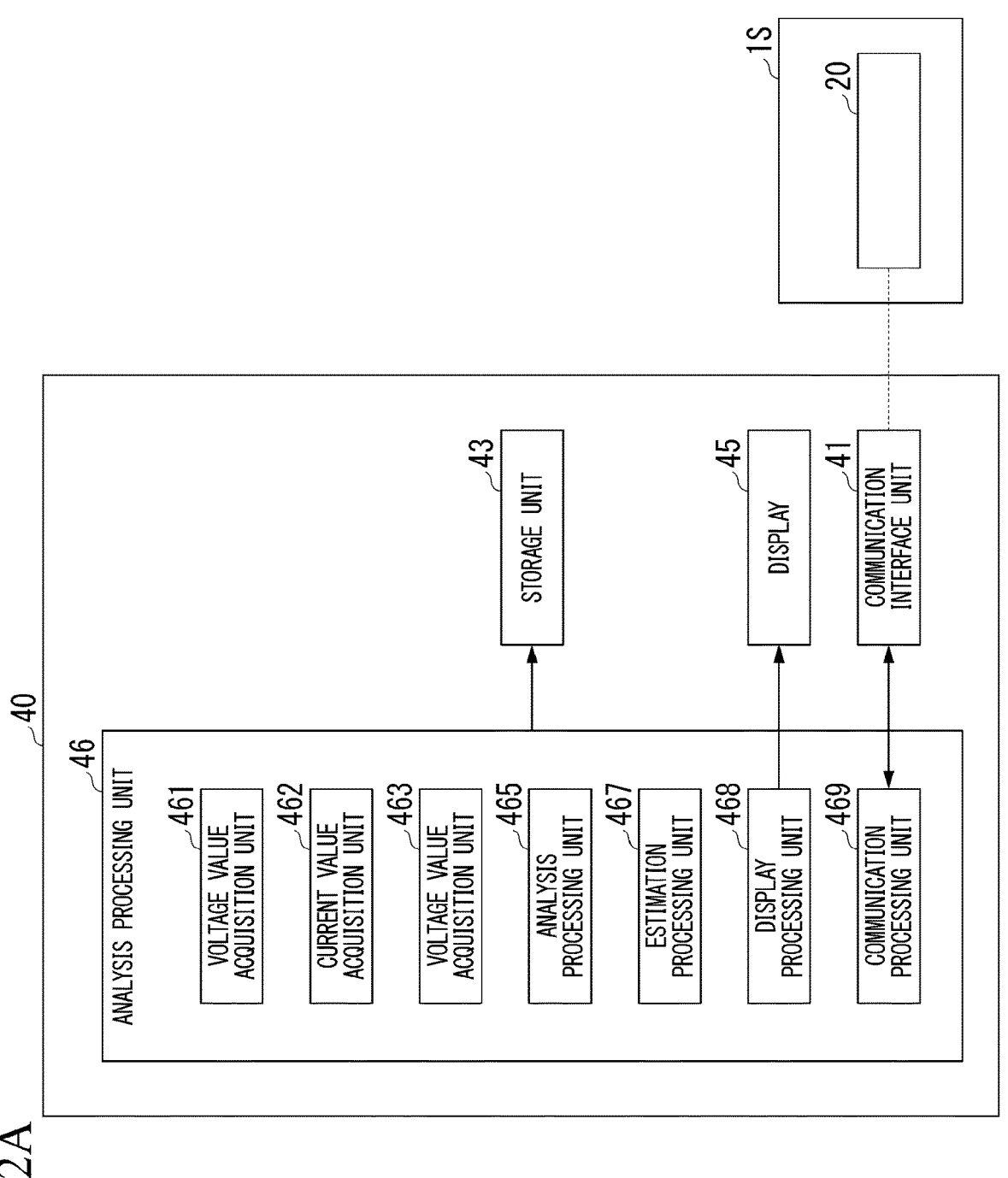
FIG. 2A is a diagram illustrating a constitution of an analysis processing apparatus in the first embodiment.

FIG. 2A is a diagram illustrating a constitution of the analysis processing apparatus 40 in the first embodiment.

The analysis processing apparatus 40 includes, for example, a communication interface unit 41 (FIG. 2A includes a "communication IF unit" shown therein), a storage unit 43, a display 45, and an analysis processing unit 46.

The communication interface unit 41 communicates with an external apparatus of the analysis processing apparatus 40 under the control of the analysis processing unit 46 which will be described later. For example, the communication interface unit 41 is connected to the controller 20 in a communicable manner and communicates with the controller 20 under the control of the analysis processing unit 46 which will be described later.

The storage unit 43 is implemented using, for example, a hard disk drive (HDD), a flash memory, an electrically erasable programmable read only memory (EEPROM), a read only memory (ROM), a random access memory (RAM), or the like. For example, a region having a detection value data table TBL stored therein is provided in the storage unit 43.

The display 45 includes a display device such as a liquid crystal display which has desired information displayed under the control of the analysis processing unit 46 which will be described later.

The analysis processing unit 46 analyzes a progress state of deterioration of the IGBT 61 using a current detection value representing a current detected by the current sensor 8 and a voltage detection value representing a voltage detected by the voltage detection circuit 11.

For example, the analysis processing unit 46 includes a voltage value acquisition unit 461, a current value acquisition unit 462, a temperature detection value acquisition unit 463, an analysis processing unit 465, an estimation processing unit 467, a display processing unit 468, and a communication processing unit 469.

The voltage value acquisition unit 461, the current value acquisition unit 462, the temperature detection value acquisition unit 463, the analysis processing unit 465, the estimation processing unit 467, the display processing unit 468, and the communication processing unit 469 are implemented using, for example, a hardware processor such as a central processing unit (CPU) executing a program (software). Furthermore, some or all of these constituent elements may be implemented using hardware (a circuit unit; including a circuitry) such as a large scale integration (LSI), an application specific integrated circuit (ASIC), a field-programmable gate array (FPGA), and a graphics processing unit (GPU) or may be implemented in cooperation with software and hardware.

The voltage value acquisition unit 461 acquires a detection value (first time series data) representing a voltage between the main terminals of the IGBT 61 detected using the voltage detection circuit 11 and adds the detection value (the first time series data) to voltage detection value data of the storage unit 43. Furthermore, the voltage value acquisition unit 461 acquires a detection value representing a prescribed number of voltage detection values stored in the voltage detection value data of the storage unit 43 and outputs the detection value to the analysis processing unit 465. The voltage value acquisition unit 461 may acquire a voltage detection value from the voltage detection circuit 11 and reads out a voltage detection value from the voltage detection value data of the storage unit 43 in parallel.

The current value acquisition unit 462 acquires a current detection value (second time series data) representing an electric current detected using the current detection circuit 12 and adds the current detection value (the second time series data) to current detection value data of the storage unit 43. Furthermore, the current value acquisition unit 462 acquires a detection value representing a prescribed number of current detection values stored in the storage unit 43 and outputs the detection value to the analysis processing unit 465. The current value acquisition unit 462 may acquire a current detection value from the current detection circuit 12 and read out a current detection value from the storage unit 43 in parallel.

The temperature detection value acquisition unit 463 acquires a detection value (a temperature detection value) representing a temperature of the IGBT 61 detected using the temperature detection circuit 13 and adds the detection value (the temperature detection value) to temperature detection value data of the storage unit 43.

Furthermore, a detection value representing a prescribed number of temperature detection values stored in the temperature detection value data of the storage unit 43 is acquired and output to the estimation processing unit 467. The temperature detection value acquisition unit 463 may acquire a voltage detection value from the voltage detection circuit 11 and read out a voltage detection value from the voltage detection value data of the storage unit 43 in parallel.

FIG. 2B is a diagram for explaining an example of the detection value data table TBL in the first embodiment.

The detection value data table TBL includes items such as a time history identifier, voltage value data, current value data, and temperature detection value data. The voltage value data, the current value data, the temperature detection value data, and the like are associated with each other using data concerning the time history identifier as a key. Timings at which the voltage value data, the current value data, and the temperature detection value data are sampled may not be exactly the same and are allowed to deviate in a time axis direction within a range in which the timings are synchronized with each other.

The voltage value acquisition unit 461, the current value acquisition unit 462, and the temperature detection value acquisition unit 463 described above are examples of a data acquisition unit. For example, the voltage value acquisition unit 461 acquires first time series data, associates voltage value data of the first time series data corresponding to the time history identifier with the time history identifier, and adds the association to the detection value data table TBL. The current value acquisition unit 462 acquires second time series data, associates current value data of the second time series data corresponding to the time history identifier with the time history identifier, and adds the association to the detection value data table TBL. The temperature detection value acquisition unit 463 acquires third time series data, associates temperature detection value data of the third time series data corresponding to the time history identifier with the time history identifier, and adds the association to the detection value data table TBL. Through the above processing, the voltage value acquisition unit 461 and the current value acquisition unit 462 described above can combine voltage value data of the first time series data and current value data of the second time series data using, at least the time history identifier as a key.

The time history identifier may be used as long as a time (a timing) can be uniquely identified and may be a series of numbers in addition to data indicating a specific time. Alternatively, the time history identifier may be obtained by combining identification information regarding a gate pulse and a series of numbers in the gate pulse.

The description will be continued with reference to FIG. 2A again.

The analysis processing unit 465 obtains a saturation voltage characteristic of the IGBT 61 through, for example, a prescribed process based on the saturation voltage Vce (sat) of the IGBT 61 and the data concerning the collector current Ic. The analysis processing unit 465 obtains a saturation voltage characteristic of the freewheeling diode 62 through the same process. The details will be described later.

The estimation processing unit 467 detects a change over time of a saturation voltage characteristic of the IGBT 61 obtained through analysis using the analysis processing unit 465 and outputs information indicating that deterioration is progressing when a change exceeding a prescribed value is detected. For example, the saturation voltage characteristic of the IGBT 61 changes a slope of a graph drawn on a V-I coordinate plane if the deterioration progresses. For example, the reciprocal of the slope of the graph is determined as an index value indicating a deterioration status. This value can be calculated as a ratio corresponding to a change in voltage to a change in current. The estimation processing unit 467 may output information indicating an alarm or caution when one threshold value is used and an index value exceeding this threshold value is detected. The estimation processing unit 467 may estimate a state associated with the progress of deterioration of the freewheeling diode 62 by detecting a change over time of a conduction characteristic of the freewheeling diode 62 of the IGBT 61 on the basis of a distribution of the projected points.

The display processing unit 468 causes the display 45 to display the result of estimation processing using the estimation processing unit 467. When it is estimated that there is an IGBT 61 or a freewheeling diode 62 whose deterioration has progressed as a result of the estimation processing using the estimation processing unit 467, the display processing unit 468 may cause the display 45 to display the fact that the deterioration is progressing in addition to the details regarding the IGBT 61 or the freewheeling diode 62 which has been presumed to be deteriorating.

The communication processing unit 469 communicates with the controller 20 via the communication interface unit 41 on the basis of the control of the voltage value acquisition unit 461, the current value acquisition unit 462, and the temperature detection value acquisition unit 463.

A basic principle of the state estimation system 1 for the power conversion semiconductor apparatus according to this embodiment will be described below.

(Basic Principle)

The state estimation system 1 detects the saturation voltage characteristic of the IGBT 61 on the basis of the saturation voltage Vce (sat) of the IGBT 61 and the collector current Ic using the IGBT 61 as an evaluation target. The state estimation system 1 estimates the state (a deterioration status) on the basis of a change in the saturation voltage characteristic of the IGBT 61 when the deterioration of the IGBT 61 progresses.

Also, the state estimation system 1 detects a conduction characteristic of the freewheeling diode 62 on the basis of the forward voltage $V_F$ of the freewheeling diode 62 and the forward current $I_F$ using the freewheeling diode 62 as an evaluation target. The state estimation system 1 estimates the state (a deterioration status) on the basis of a change in the conduction characteristic of the freewheeling diode 62 when the deterioration of the freewheeling diode 62 progresses. The state estimation system 1 is not limited to individually using the IGBT 61 and the freewheeling diode 62 as evaluation targets and can evaluate the IGBT 61 and the freewheeling diode 62 using a shared measurement system.

In the following description, in order to simplify the description, the description will be provided using a case in which the IGBT 61 is used as an evaluation target. A case in which the freewheeling diode 62 is used as an evaluation target is the same as the case of the IGBT 61.

The state estimation system 1 has the following elemental techniques:

"Detection technique" in which a saturation voltage characteristic of the IGBT 61 is detected while the power conversion apparatus (the converter 4 or the inverter 6) is in operation;

"Data collection technique" in which an electrical characteristic of the IGBT 61 while the power conversion apparatus (the converter 4 or the inverter 6) is in operation is continuously logged for a prescribed period of time; and "Analysis technique" in which a state associated with the progress of deterioration of the IGBT 61 is analyzed.

These techniques will be described in order below.

(Detection Technique)

The voltage detection circuit 11 and the current detection circuit 12 are used for detecting a saturation voltage characteristic of the IGBT 61.

The voltage detection circuit 11 detects a voltage (a saturation voltage) between the main terminals of the IGBT 61 in a status in which driving is performed under the pulse width modulation (PWM) control.

If a gate signal of the PWM control corresponding to a gate pulse GP (a control pulse) is supplied to a gate of the IGBT 61, as a result, the IGBT 61 is repeatedly turned on/off. The voltage detection circuit 11 detects a saturation voltage (Vce (sat)) of the IGBT 61 or the current detection circuit 12 detects the collector current Ic so that an influence is not provided for the PWM control in such an operating situation.

In line with this, the temperature detection circuit 13 detects a temperature of the IGBT 61. The temperature of the IGBT 61 may be a temperature of a case having the IGBT 61 built therein, a temperature of heat radiation fins, or the like. The temperature of the IGBT 61 is used as a representative of these temperatures.

Figure 3A:
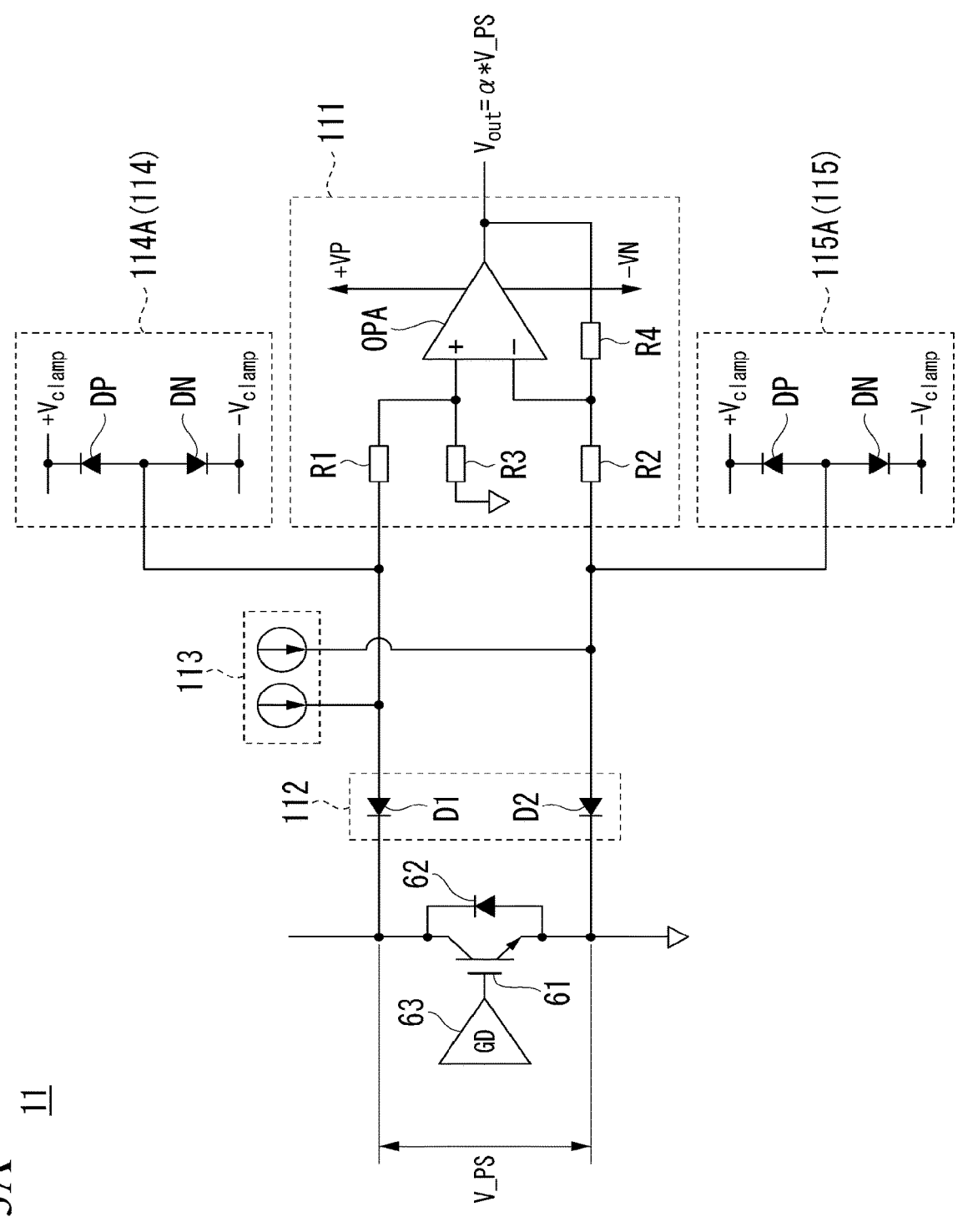
FIG. 3A is a diagram illustrating a constitution of a voltage detection circuit in the first embodiment.

A constitution of the voltage detection circuit 11 will be described with reference to FIG. 3A. FIG. 3A is a diagram illustrating the constitution of the voltage detection circuit 11 in the embodiment.

The voltage detection circuit 11 includes a differential amplifier 111, an insulating diode 112, a bias circuit 113, and a clamp circuit 114.

The differential amplifier 111 is configured to differentially detect a potential difference between an emitter potential and a collector potential of the IGBT 61 (a potential difference between the main terminals).

For example, the differential amplifier 111 includes an operational amplifier OPA and resistors R1 to R4 forming peripheral circuits thereof. An amplification factor GAIN defined in Expression (1) can be obtained by determining the resistors R1 to R4 to a prescribed value.

$$GAIN=(R3)/(R1) \tag{1}$$

Here, (R1)=(R2) and (R3)=(R4) are satisfied.

DC power for driving is supplied to a power supply terminal of the operational amplifier OPA with a positive voltage (+VP) and a negative voltage (−VP).

Each input of the differential amplifier 111 is connected to an emitter and a collector of the IGBT 61 (hereinafter referred to as a "pair of main terminals") via the insulating diode 112.

The insulating diode 112 includes insulating diodes D1 and D2. The insulating diodes D1 and D2 are examples of a pair of insulating diodes. For example, the insulating diode D1 includes a cathode connected to the collector of the IGBT 61 and an anode connected to a non-inverting input of the operational amplifier OPA via the resistor R1. The insulating diode D2 includes a cathode connected to the emitter of the IGBT 61 and an anode connected to an inverting input of the operational amplifier OPA via the resistor R2. In the following description, when the insulating diodes D1 and D2 will be described without distinction, the insulating diodes D1 and D2 are simply referred to as an "insulating diode 112." The insulating diode 112 has a dielectric strength characteristic of an open circuit voltage Vce (open) of higher of the IGBT 61 during operation.

The bias circuit 113 is configured to allow an equal amount of bias current to flow through each of the pair of main terminals via the insulating diode 112. The bias circuit 113 includes, for example, a constant current source composed of a current mirror circuit. The bias circuit 113 acts to cause electricity to pass through the insulating diode 112 with a potential of each of the main terminals of the IGBT 61.

A combination of the clamp circuits 114 and 115, the insulating diode 112, and the bias circuit 113 forms a diode switch. The clamp circuits 114 and 115 limit the application of an excessive voltage to each input of the differential amplifier 111 using the above combination.

For example, the clamp circuit 114A illustrated in FIG. 3A includes diodes DP and DN and limits an overvoltage of a non-inverting input terminal of the operational amplifier OPA using a positive limiting voltage (+V_clamp) and a negative limiting voltage (−V_clamp). A clamp circuit 115A includes diodes DP and DN and limits an overvoltage of an inverting input terminal of the operational amplifier OPA using a positive limiting voltage (+V_clamp) and a negative limiting voltage (−V_clamp). For example, the diodes DP and DN include anodes connected and are connected to an input of the differential amplifier 111. The diode DP includes a cathode connected to a pole of the positive limiting voltage (+V_clamp). The diode DN cathode is connected to a pole of the negative limiting voltage (−V_clamp). The clamp circuits 114A and 115A are examples of the clamp circuits 114 and 115.

The clamp circuits 114A and 115A limit an excessive voltage exceeding a range from the negative limiting voltage (−V_clamp) to the positive limiting voltage (+V_clamp) using, for example, the positive limiting voltage (+V_clamp) used for limiting a voltage higher than a reference potential (a potential of a pole GG) and the negative limiting voltage (−V_clamp) used for limiting a voltage lower than a reference potential (the potential of a pole GG). The positive limiting voltage (+V_clamp) which defines an upper limit is, for example, a voltage lower than a positive power supply voltage of the differential amplifier 111 and set to exceed a measurement range of the saturation voltage (Vce (sat)) of the IGBT 61. This relationship is expressed by Expression (2). For example, a maximum value of an allowable input voltage of the operational amplifier OPA is set to a positive power supply voltage +VP.

$$V\_UL<+V\_clamp<+VP \tag{2}$$

The negative limiting voltage (−V_clamp) which defines a lower limit is, for example, a voltage higher than a negative power supply voltage of the differential amplifier 111 and set to exceed a measurement range of the forward voltage ($V_F$) of the freewheeling diode. The relationship is expressed by Expression (3). For example, a minimum value of the allowable input voltage of the operational amplifier OPA is set to a negative power supply voltage −VP.

$$V\_LL>-V\_clamp>-VP \tag{3}$$

As described above, when a clamp voltage having a noise margin is set with respect to the allowable input voltage of the operational amplifier OPA, it is possible to reduce the failure of the operational amplifier OPA due to the mixing of surge noise.

Figure 3B:
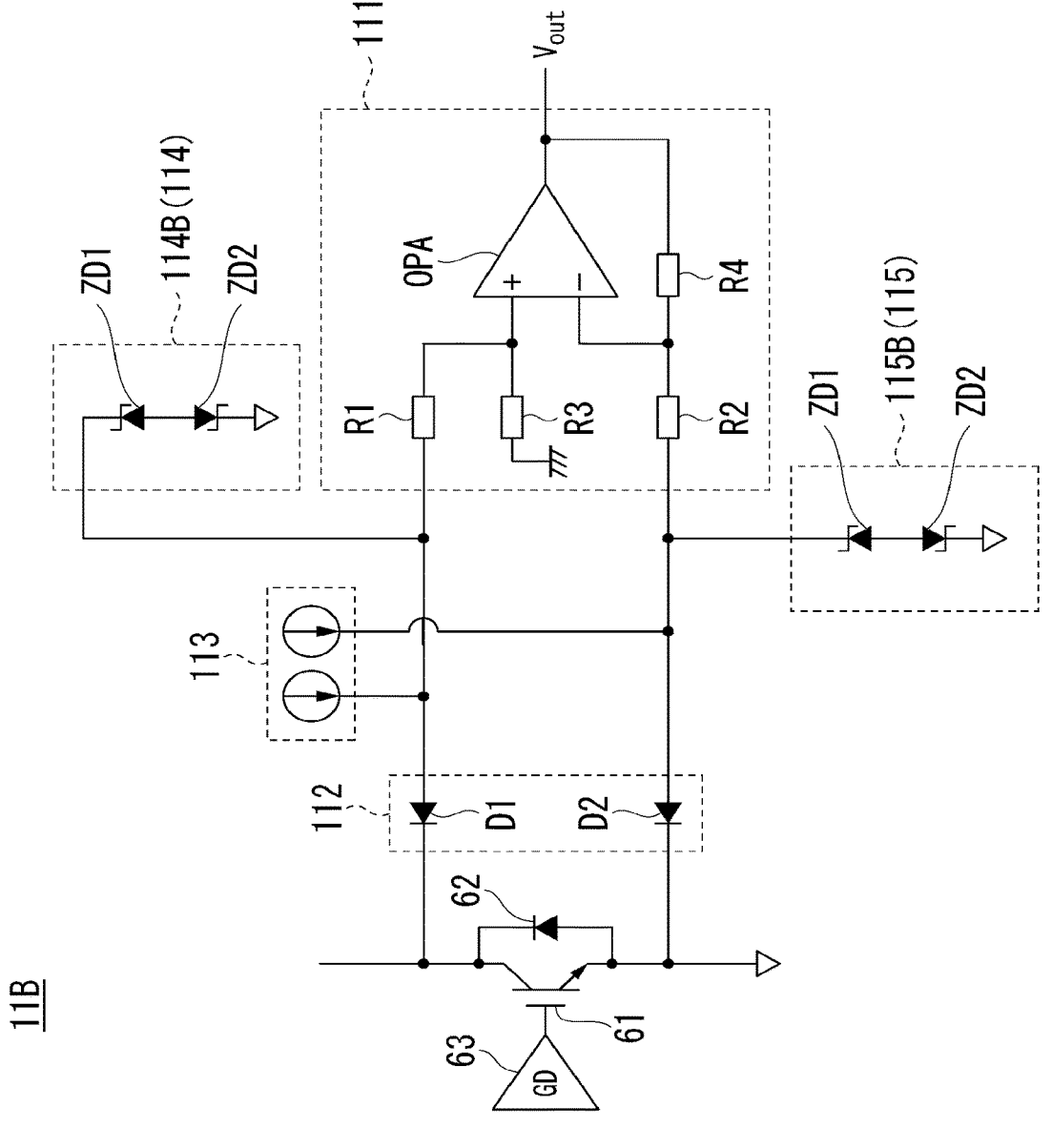
FIG. 3B is a diagram illustrating a constitution of a voltage detection circuit in a first modification.

Modifications in which constitutions of the clamp circuit are different will be described with reference to FIGS. 3B and 3C. Since the clamp circuit illustrated in FIGS. 3B and 3C does not require a power supply configured to supply a clamping voltage, the circuit can be simplified. FIG. 3B is a diagram illustrating a constitution of a voltage detection circuit 11B in a first modification.

Clamp circuits 114B and 115B include Zener diodes ZD1 and ZD2. The Zener diodes ZD1 and ZD2 are connected in series with the polarities thereof opposite to each other. The Zener diode ZD1 includes a cathode connected to a signal wire of a differential amplifier 111 on each input side and the Zener diode ZD2 includes a cathode connected to a pole GG of a reference potential. The Zener diodes ZD1 and ZD2 include anodes connected to each other and connected to inputs of the differential amplifier 111.

The clamp circuits 114B and 115B limit a voltage of each input of the differential amplifier 111 to a rated voltage of the Zener diodes ZD1 and ZD2 without using the clamping voltage. In this way, the voltage detection circuit 11B also acts as in the voltage detection circuit 11 described above. In the case of this modification, when the Zener diode ZD2 is provided in a clamp circuit 115B, a negative voltage can be measured and a bidirectional withstand voltage power semiconductor can be used as a measurement target.

Figure 3C:
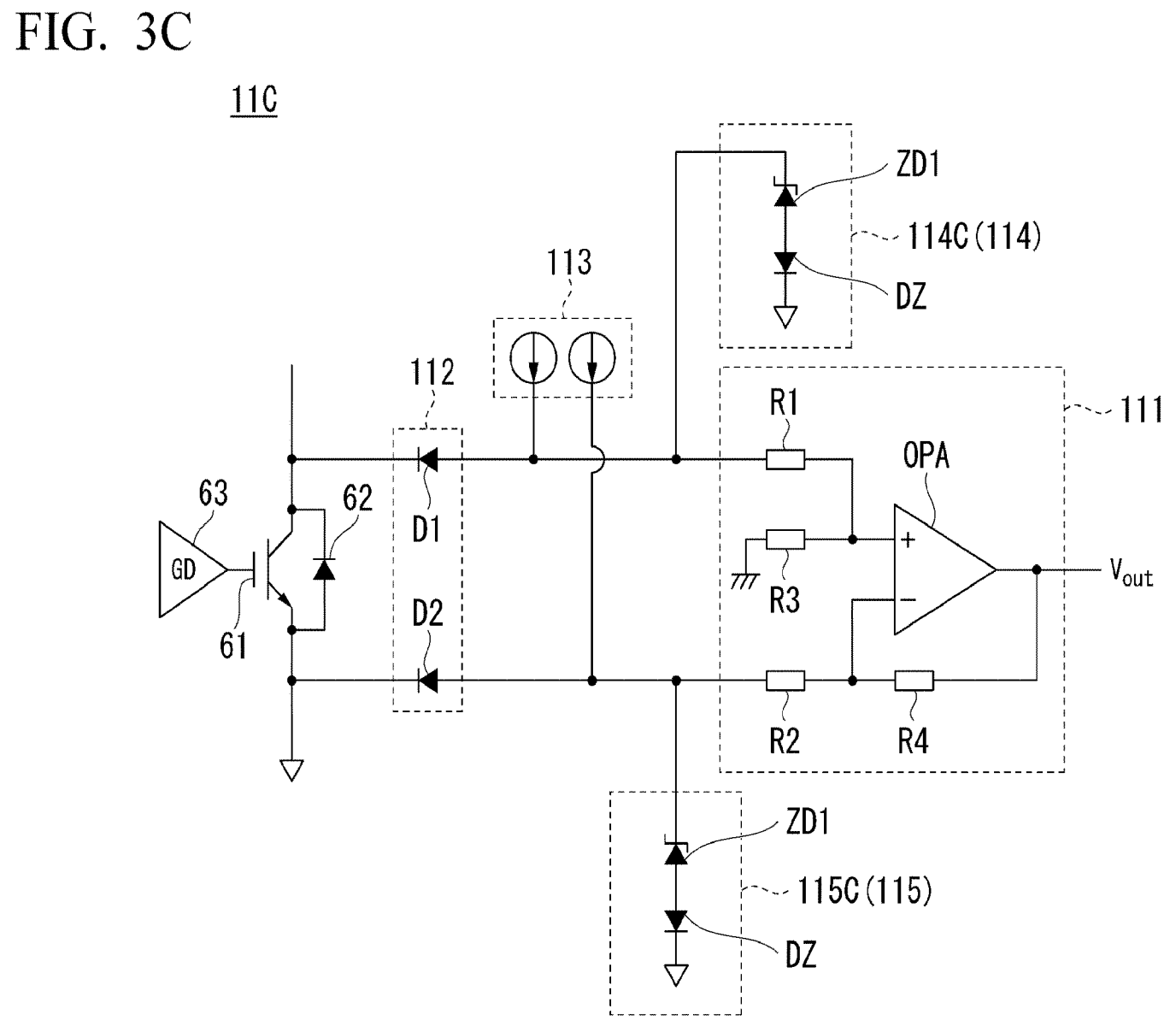

FIG. 3C is a diagram illustrating a constitution of a voltage detection circuit 11C in a second modification.

Clamp circuits 114C and 115C include a Zener diode ZD1 and a diode DZ. The Zener diode ZD1 and a diode DZ are connected in series with polarities thereof opposite to each other. The Zener diode ZD1 includes a cathode connected to a signal wire of the differential amplifier 111 on each input side and the diode DZ includes a cathode connected to a pole GG of a reference potential. The Zener diode ZD1 and the diode DZ include anodes connected to each other and connected to an input of the differential amplifier 111.

The clamp circuits 114C and 115C limit a voltage of each input of the differential amplifier 111 to a voltage obtained by adding a rated voltage of the Zener diode ZD1 to a forward voltage of the diode DZ without using a clamping voltage as in the clamp circuits 114B and 115B described above. In this way, the voltage detection circuit 11C also acts as in the voltage detection circuit 11 described above. In the case of the voltage detection circuit 11C, a measurement range is limited to a positive voltage.

A state change of the voltage detection circuit 11 will be described below with reference to FIGS. 4A to 4C.

Figure 4A:
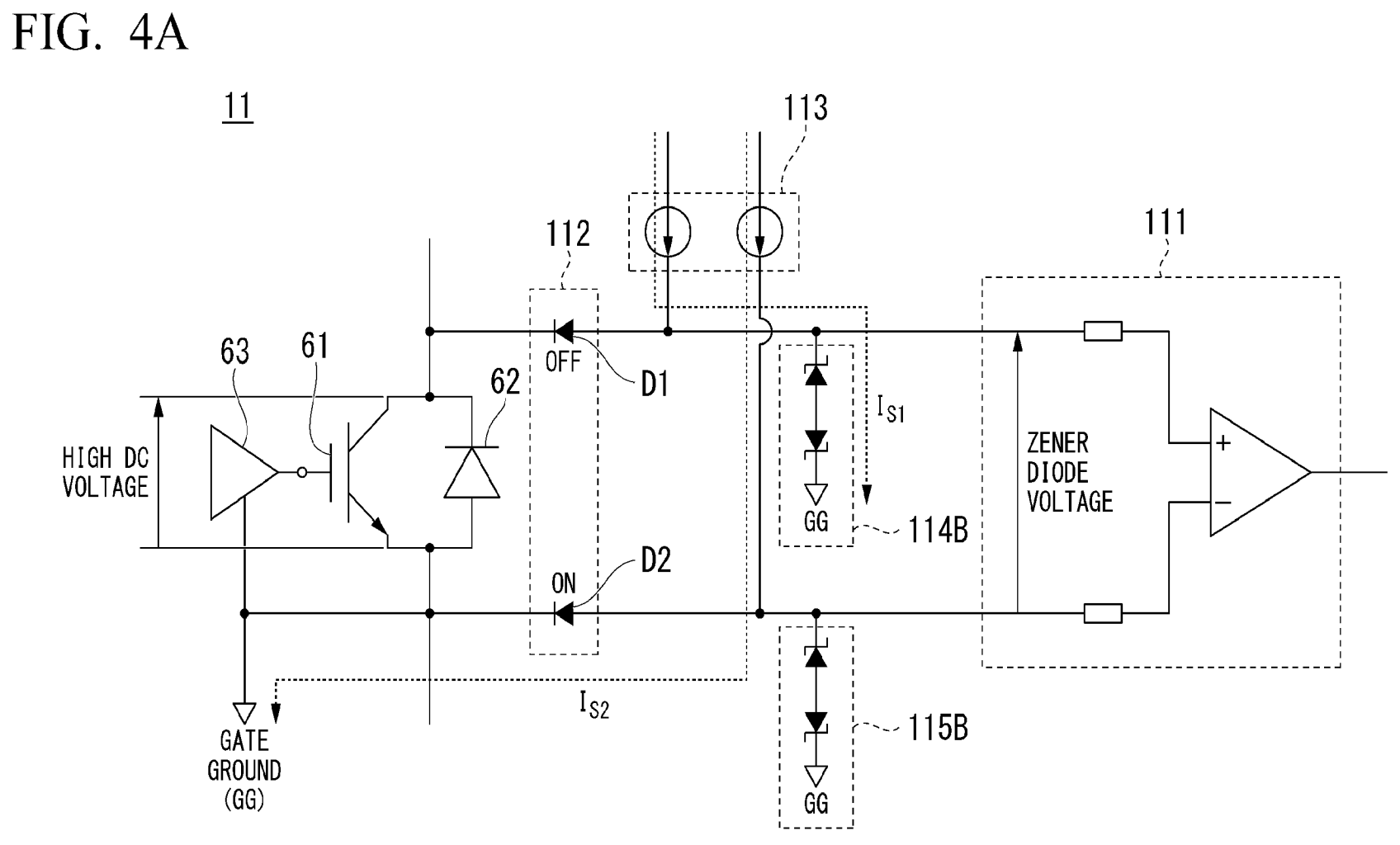
Figure 4B:
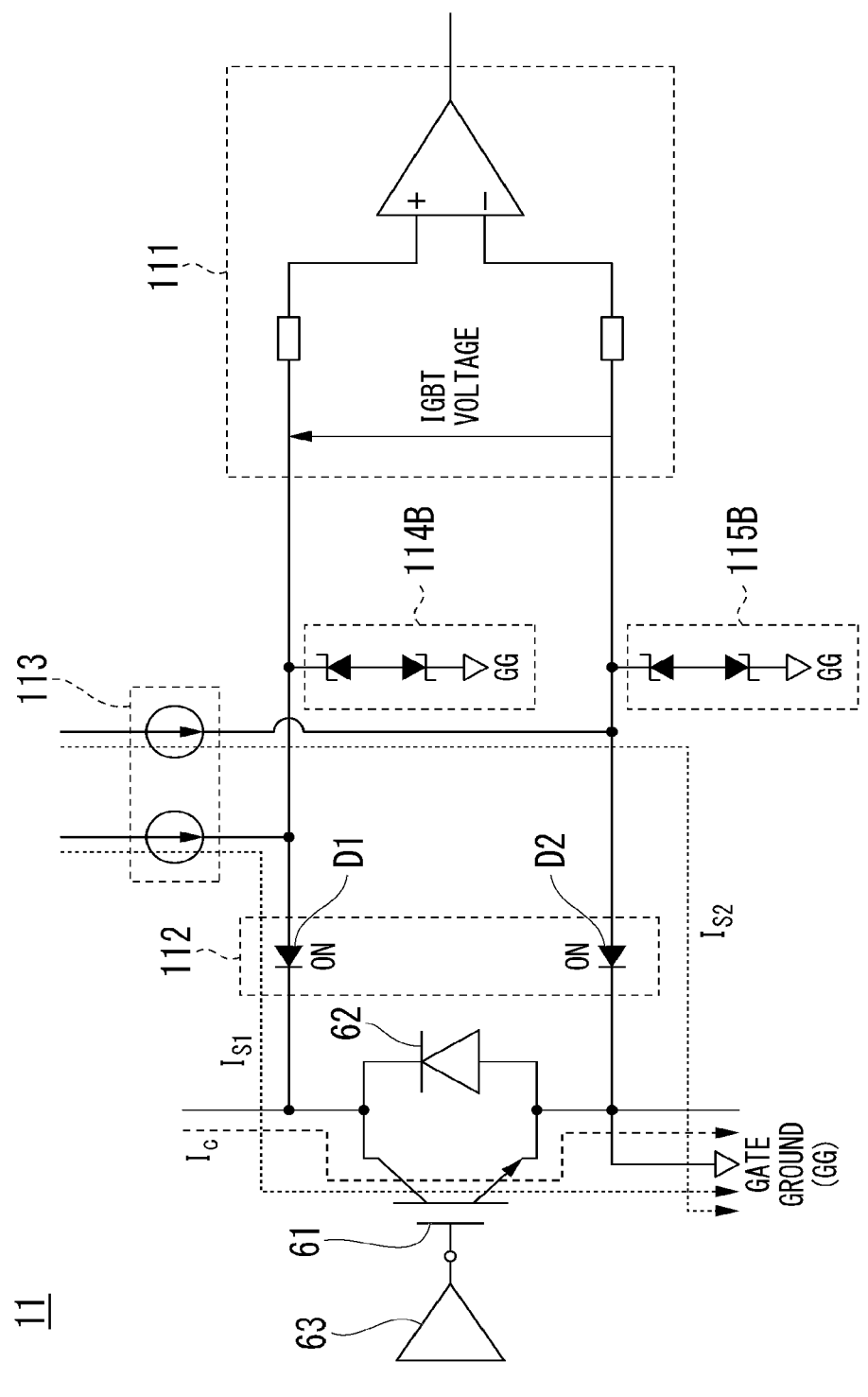
FIG. 4B is a diagram for explaining a state change of the voltage detection circuit in the first embodiment.
Figure 4C:
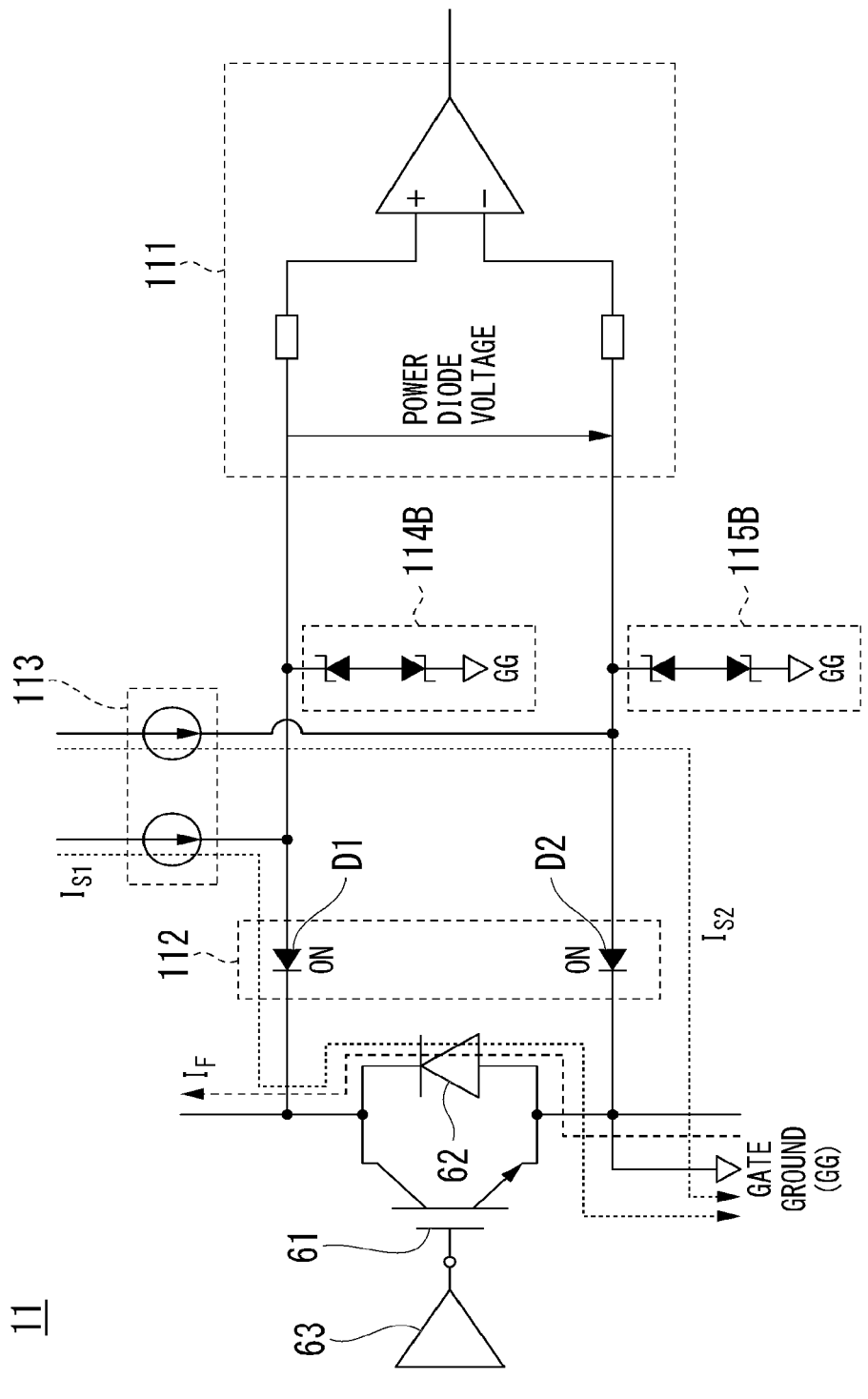
FIG. 4C is a diagram for explaining a state change of the voltage detection circuit in the first embodiment.

FIGS. 4A to 4C are diagrams for explaining the state change of the voltage detection circuit 11 in the embodiment. Although the description will be provided using the clamp circuit in FIG. 3B to simplify the description, the same applies to a case in which the clamp circuit in FIG. 3A is used. The state illustrated in FIG. 4A shows a state in which an IGBT 61 is blocked (a blocking state). The state illustrated in FIG. 4B shows a state in which a saturation voltage Vce (sat) of the IGBT 61 can be detected. The state illustrated in FIG. 4C shows a state in which a forward voltage $V_F$ of a freewheeling diode 62 can be detected.

If the IGBT 61 is turned on/off, a voltage of each main terminal of the IGBT 61 changes.

If the IGBT 61 is blocked as in a first state illustrated in FIG. 4A, a high voltage is applied between main terminals of the voltage detection circuit 11. Thus, insulating diode 112 functions as a switch (a diode switch) depending on a magnitude relationship with a bias voltage using the bias circuit 113. For example, a bias current $I_{S1}$ flows through the clamp circuit 114B, an insulating diode D1 is reverse-biased and in an off state, an insulating diode D2 is turned on, and a bias current $I_{S2}$ flows through the insulating diode D2. In this state, the differential amplifier 111 detects a voltage limited using Zener diodes ZD1 and ZD2.

If the IGBT 61 is brought into a conductive state and the insulating diodes D1 and D2 are turned on as in a second state illustrated in FIG. 4B, the bias currents $I_{S1}$ and $I_{S2}$ from the bias circuit 113 flows to the main terminals of the IGBT 61. Thus, the differential amplifier 111 can detect a potential difference between the main terminals of the IGBT 61 as a saturation voltage Vce (sat) of the IGBT 61. Strictly speaking, although a detection error corresponding to a forward voltage of the insulating diodes D1 and D2 occurs at each input of the differential amplifier 111, the detection error can be ignored in the analysis method shown below.

The voltage of each input of the differential amplifier 111 changes to follow a voltage of each terminal of the IGBT 61 as long as the voltage is within a voltage range defined using the clamp circuits 114 and 115.

A third state illustrated in FIG. 4C shows a case in which the freewheeling diode 62 is set as a measurement target. The voltage detection circuit 11 in the embodiment can detect a forward voltage characteristic of the freewheeling diode 62 in addition to the saturation voltage (Vce (sat)) of the IGBT 61. As in the third state illustrated in FIG. 4C, when the IGBT 61 is turned off, a collector potential may be lower than an emitter potential in some cases. At this time, the forward current $I_F$ flows through the freewheeling diode 62. The detection of the forward voltage characteristic can be performed using the same method as in the detection of the saturation voltage (Vce (sat)) of the IGBT 61.

The voltage detection circuit 11 (the differential amplifier 111) generates an output voltage Vout with respect to the saturation voltage (Vce (sat)) of the IGBT 61 and the forward voltage $V_F$ of the freewheeling diode 62 using a differential voltage detected using the above method. A voltage V_PS between the main terminals of the IGBT 61 is converted into a value (Vout) converted using Expression (4) in which an amplification factor GAIN of the voltage detection circuit 11 is used.

$$Vout=GAIN \times V\_PS \tag{4}$$

In order to secure the insulation between IGBTs 61, the voltage detection circuit 11 described above may be provided for each of the IGBTs 61. For example, when the voltage detection circuit 11 is installed in the gate drive circuit unit 60 of the IGBT 61, the power supply 69 in the gate drive circuit unit 60 may be shared.

The current detection circuit 12 may be provided at a position in which the current detection circuit 12 can detect the collector current Ic of the IGBT 61 and the forward current $I_F$ of the freewheeling diode 62 using the detection result of the current sensor 8. Although a case in which the current detection circuit 12 is provided for each IGBT 61 is exemplified in this embodiment, the present invention is not limited thereto and the current detection circuit 12 may be provided for each phase.

The temperature detection circuit 13 detects a temperature of the IGBT 61 using a temperature sensor 13T. For example, the temperature detection circuit 13 may be provided in each IGBT 61.

(Data Collection Technique)

A data collection technique using the data collection unit 1S has the following features.

The data collection unit 1S samples the saturation voltage Vce (sat) of the IGBT 61 detected using the voltage detection circuit 11 and the collector current Ic detected using the current detection circuit 12 and collects and records them as time series data.

The data collection unit 1S samples the forward voltage $V_F$ of the freewheeling diode 62 detected using the voltage detection circuit 11 and the forward current $I_F$ detected using the current detection circuit 12 and collects and records theme as time series data.

Sampling of the saturation voltage Vce (sat) of the IGBT 61 using the data collection unit 1S and the collector current Ic is performed in synchronization with each other so that timings are aligned with each other. The same applies to the freewheeling diode 62.

The above sampling cycle using the data collection unit 1S is set sufficiently shorter than a pulse width of the gate pulse GP for controlling the IGBT 61.

Sampling using the data collection unit 1S is continuously performed for a prescribed period in which the gate pulse GP for the IGBT 61 is continuously supplied.

The above sampling may be synchronized with the gate pulse GP for the IGBT 61, but is not necessarily required.

Optional features of the data collection unit 1S will be exemplified below.

In the data collection unit 1S, a voltage detection system circuit and a current detection system circuit may be circuits which are independent of each other due to a relationship with a withstand voltage or the like in some cases. For example, the voltage detection system circuit of the data collection unit 1S may be provided in the gate drive circuit unit 60 and the current detection system circuit may be provided on the control unit 9 side.

In the above case, it is necessary to synchronize the voltage detection system circuit and the current detection system circuit. For example, the voltage detection system circuit and the current detection system circuit may be synchronized using a timing signal or a gate pulse supplied through optical communication. The details of these will be described later.

(Analysis Technique)

The state estimation system 1 has, for example, each IGBT 61 of the inverter 6 (the power conversion apparatus) which is in operation as an evaluation target. The state estimation system 1 detects the saturation voltage characteristic of the IGBT 61 in the operating state on the basis of the saturation voltage Vce (sat) of the IGBT 61 operating under operation and the collector current Ic.

Figure 5A:
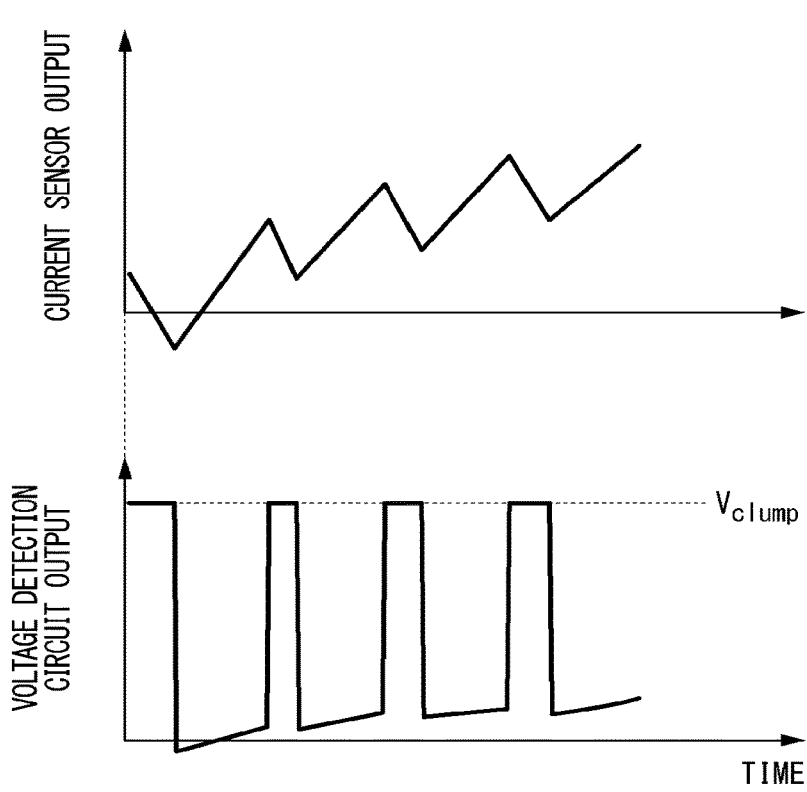
FIG. 5A is a diagram for explaining a voltage and a collector current Ic between main terminals of an insulated gate bipolar transistor (IGBT) in the first embodiment.
Figure 5B:
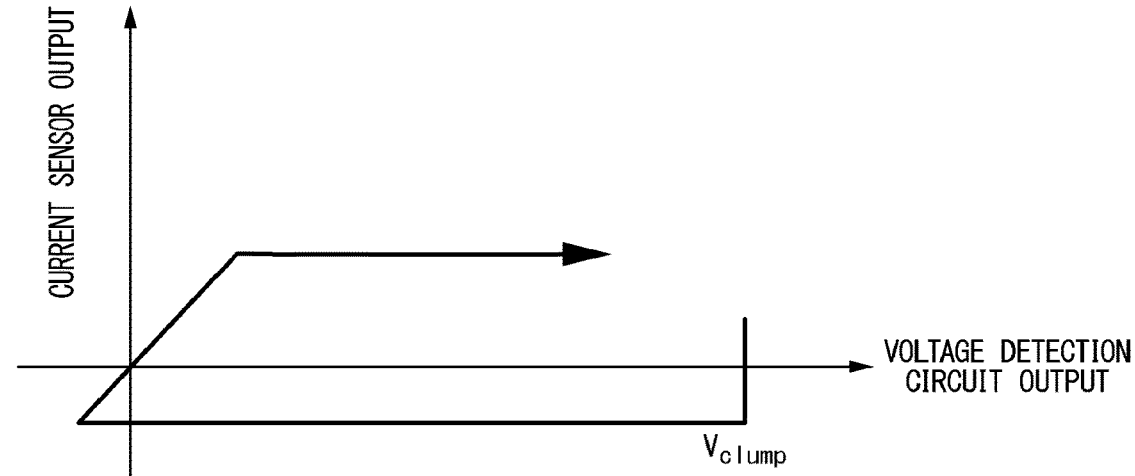
FIG. 5B is a diagram for explaining a procedure for deriving a saturation voltage characteristic using a voltage and a collector current Ic between the main terminals of the IGBT in FIG. 5A.
Figure 5C:
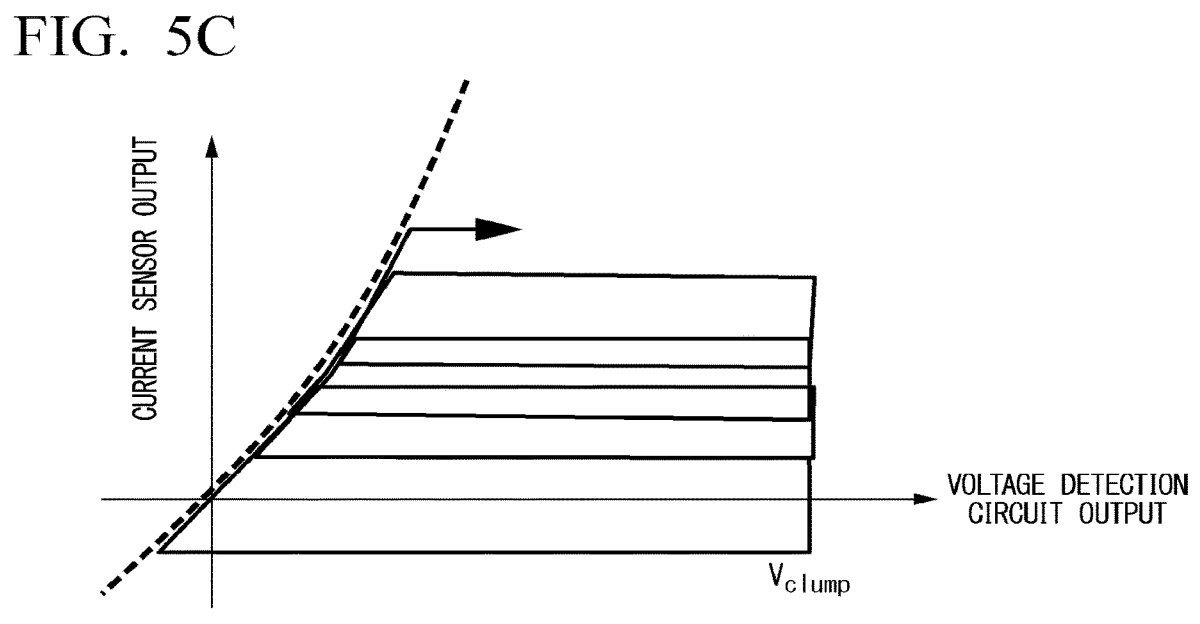

FIG. 5A is a diagram for explaining a voltage between the main terminals of the IGBT 61 in the embodiment and the collector current Ic. FIGS. 5B and 5C are diagrams for explaining a procedure for deriving a saturation voltage characteristic using the voltage between the main terminals of the IGBT 61 in FIG. 5A and the collector current Ic.

The voltage between the main terminals of the IGBT 61 illustrated in FIG. 5A and the data of the collector current Ic are used for deriving the saturation voltage characteristic. For example, this data may be recorded as time series data using the data collection unit 1S described above.

The state estimation system 1 utilizes the V-I coordinate planes illustrated in FIGS. 5B and 5C. The state estimation system 1 plots a voltage between the main terminals of the IGBT 61 of a set of data having a common sampling time and a value of the collector current Ic on the V-I coordinate plane on the basis of the voltage between the main terminals of the IGBT 61 and the data of the collector current Ic. Although the points plotted on the V-I coordinate plane are discrete, if a plurality of plots are interpolated, for each gate pulse, one substantially trapezoidal trajectory is drawn on the V-I coordinate plane (FIG. 5B).

The state estimation system 1 repeatedly performs this and plots sampling data for a plurality of gate pulses in the same manner (FIG. 5C). As a result, assuming that each trapezoidal trajectory is a trapezoid, a curve showing the saturation voltage characteristic (a saturation voltage char-acteristic curve) of the IGBT 61 is obtained from a broken line obtained by interpolating a trapezoidal left leg (a leg close to a current axis) illustrated in FIG. 5C so that the trapezoidal left leg is connected.

According to this embodiment, it is possible to obtain a curve showing the saturation voltage characteristic (a satu-ration voltage characteristic curve) of the IGBT 61 which is in operation. A feature amount of the curve showing the saturation voltage characteristic changes when the deterio-ration of the IGBT 61 progresses. The state estimation system 1 detects this change from the saturation voltage characteristic curve detected during operation to detect that a failure occurrence rate is increasing and outputs informa-tion for replacing the IGBT 61 or the like before a failure occurs. This makes it possible to reduce the occurrence of an event in which the power conversion apparatus suddenly stops.

Figure 5D:
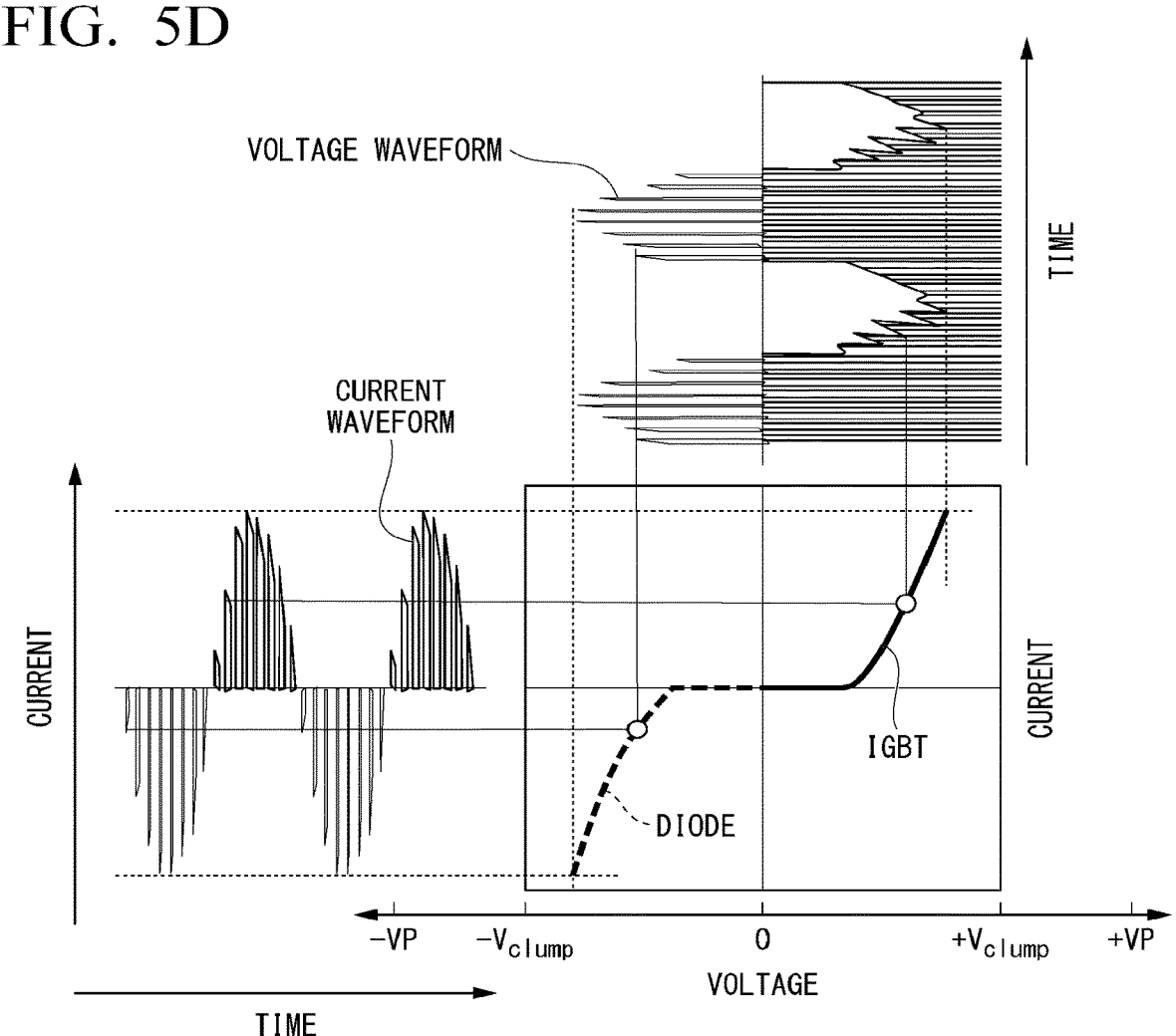
FIG. 5D is a diagram for explaining a relationship between a voltage and a collector current Ic between main terminals of an IGBT 61 in FIG. 5A and a relationship between a forward voltage $V_F$ and a forward current $I_F$ of a freewheeling diode 62.

FIG. 5D is a diagram for explaining a relationship between the voltage between the main terminals of the IGBT 61 in FIG. 5A and the collector current Ic and a relationship between the forward voltage $V_F$ of the freewheeling diode 62 and the forward current $I_F$. The relationship of the voltage between the main terminals of the IGBT 61 and the collector current Ic and the relationship between the forward voltage $V_F$ of the freewheeling diode 62 and the forward current $I_F$ are shown on the V-I coordinate plane illustrated in the square in FIG. 5D. A voltage waveform to be detected is shown in a direction in a current axis extends. A current waveform to be detected is shown in a direction in a voltage axis extends. A period during which the voltage waveformn and the current waveform are detected at this time are associated with each other.

A period during which the inverter 6 is operated includes a period during which the gate pulse is applied to the IGBT 61 and a period during which the gate pulse is not applied to the IGBT 61. During the period during which the gate pulse is not applied to the IGBT 61, an event in which the main terminals of the IGBT 61 are reverse-biased occurs. A current flowing at this time flows through the freewheeling diode 62. The state estimation system 1 applies the gate pulse illustrated in FIGS. 5A to 5C to the IGBT 61 and continues the measurement similar to the period during which the relationship between the voltage between the main terminals and the collector current Ic during the period during which the gate pulse is not applied to the IGBT 61. Thus, the state estimation system 1 can obtain the forward voltage characteristic of the freewheeling diode 62 in addi-tion to the saturation voltage characteristic of the IGBT 61.

(Detection Result)

Figure 6A:
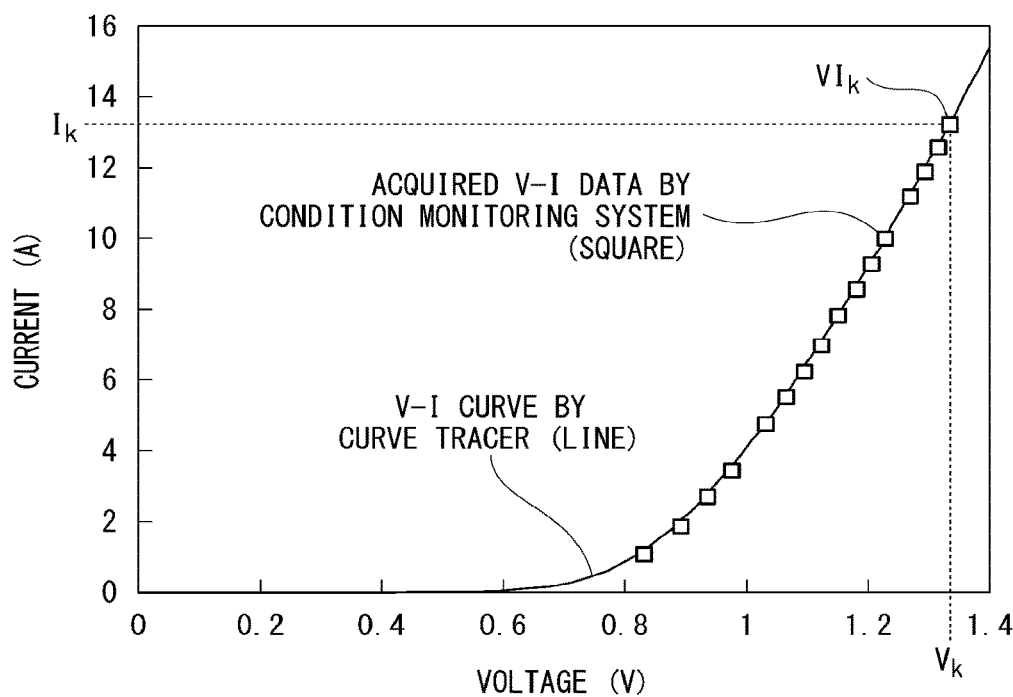
FIG. 6A is a diagram for explaining a detection result of a saturation characteristic of the IGBT in the first embodiment.
Figure 6B:
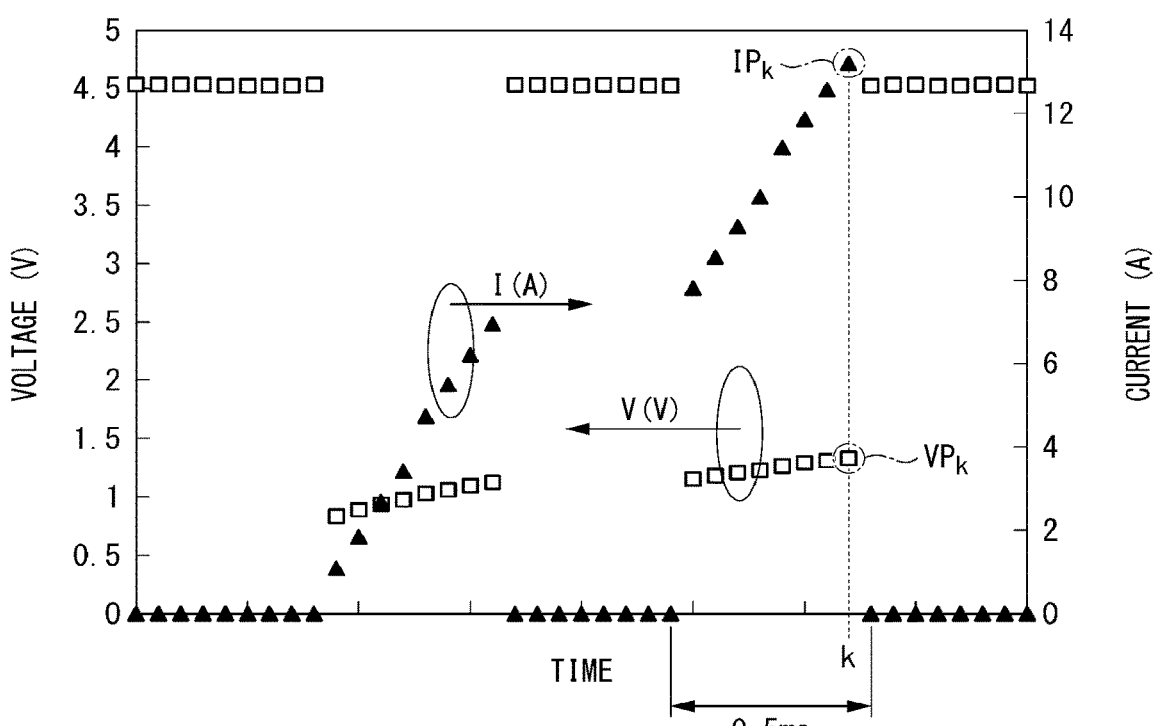
FIG. 6B is a diagram for explaining detection results of the saturation voltage and the saturation current of the IGBT corresponding to FIG. 6A.

The detection result of the saturation characteristic of the IGBT 61 in the embodiment will be described with reference to FIGS. 6A and 6B. FIG. 6A is a diagram for explaining the detection result of the saturation characteristic of the IGBT 61 in the embodiment. FIG. 6B is a diagram for explaining the detection result of the saturation voltage and the satu-ration current of the IGBT 61 corresponding to FIG. 6A.

The V-I characteristic diagram is shown in FIG. 6A, a voltage (a saturation voltage) between the main terminals of the IGBT 61 is assigned to a horizontal axis thereof and a current (a saturation current) is assigned to a vertical axis thereof. The solid line in FIG. 6A shows the result of measurement using a commercially available curve tracer and □ (square) shows the detection result (the detection value) detected using a method of this embodiment.

The timing chart in FIG. 6B shows the results of sampling the saturation voltage and the saturation current of the IGBT 61. The horizontal axis of the timing chart in FIG. 6 indicates the passage of time, a voltage value is assigned to the left vertical axis of the timing chart, and a current value is assigned to the right vertical axis.

□ (square) indicates the detection result of the saturation voltage and ▲ (triangle) indicates the detection result of the saturation current. The saturation voltage and the saturation current are sampled at the time at which □ and ▲ are arranged. In this measurement system, the sampling is performed at a prescribed timing obtained by adjusting a timing so that the simultaneousness of a sampling timing of the saturation voltage and a sampling timing of the satura-tion current is maintained.

The measurement result in a state in which a PWM control frequency is set to 1 kHz and a modulation factor is adjusted so that a duty ratio is 0.5 is shown. It is shown that the gate pulse GP is generated twice with a range of the time axis of this timing chart and the IGBT 61 is turned on twice.

For example, the last sampling within a period of a second gate pulse is identified using k. The measurement points Vlk in the V-I characteristic diagram described above are asso-ciated with each other on the basis of the values indicated by a saturation voltage measurement point VPk and a saturation current measurement point IPk corresponding to this sampling k.

As described above, the saturation voltage and the saturation current are discretized through sampling and the measurement data is collected. Each detection value is associated with a time history (k) at the time of sampling.

Figure 7:
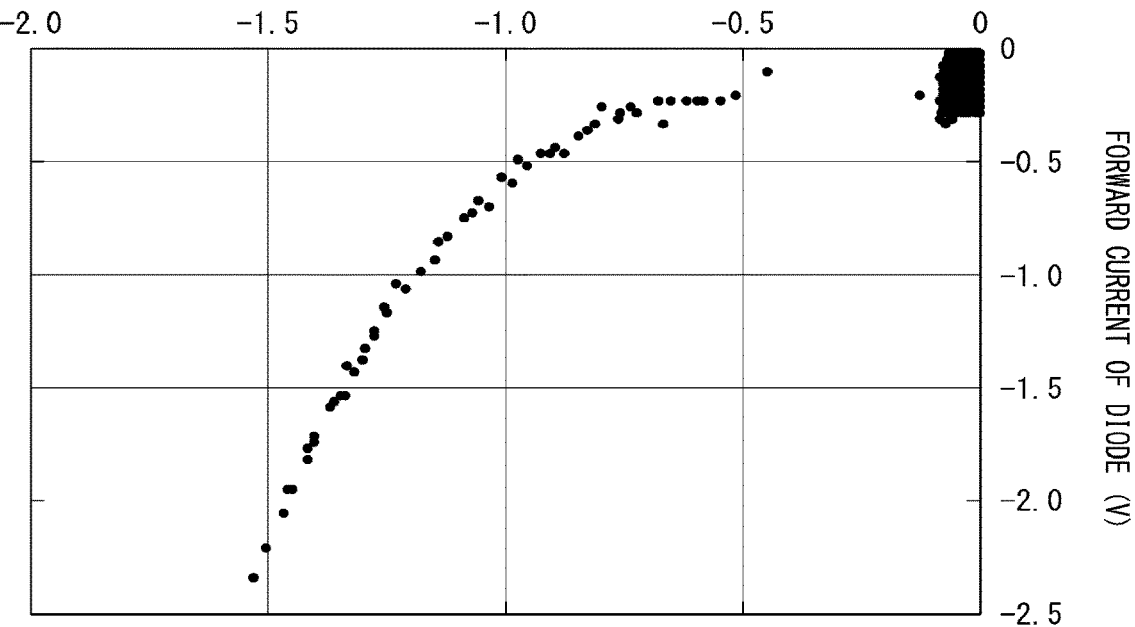
FIG. 7 is a diagram for explaining a detection result of a saturation voltage characteristic of a freewheeling diode in the first embodiment.

The detection result of the saturation characteristic of the freewheeling diode 62 in the embodiment will be described with reference to FIG. 7. FIG. 7 is a diagram for explaining the detection result of the saturation characteristic of the freewheeling diode 62 in the embodiment.

The V-I characteristic diagram is shown in FIG. 7, the forward voltage $V_F$ of the freewheeling diode 62 is assigned to a horizontal axis thereof, and the forward current $I_F$ is assigned to a vertical axis thereof. The dots in FIG. 7 indicate the detection results detected through the method of this embodiment.

Figure 8:
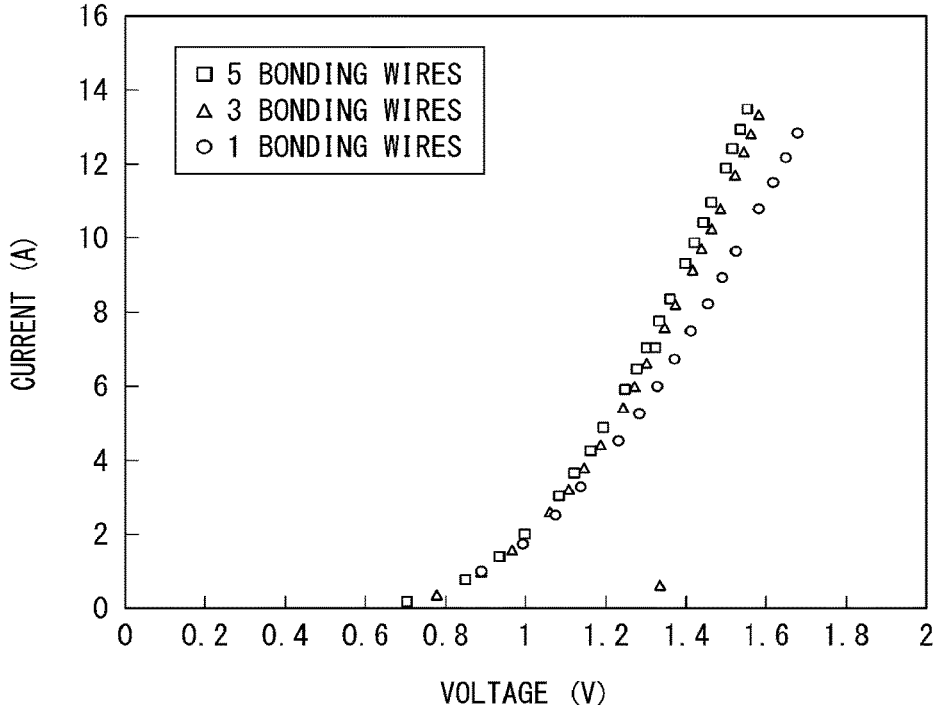
FIG. 8 is a diagram for explaining a detection result of a saturation characteristic in a case in which a constitution of a bonding wire of the IGBT in the first embodiment is changed.

A comparison result of a case in which a constitution of a bonding wire of the IGBT 61 in the embodiment is changed will be described with reference to FIG. 8. FIG. 8 is a diagram for explaining the detection result of the saturation characteristic of the case in which the constitution of the bonding wire of the IGBT 61 in the embodiment is changed. Axes of the graph in FIG. 8 are the same as those in FIG. 6A described above.

FIG. 8 illustrates the saturation voltage characteristic of a case in which the number of bonding wires is changed to one, three, and five to simulate disconnection of the bonding wires. It can be seen that a slope of the graph becomes gentler when the number of bonding wires decreases. This is because, when the number of bonding wires decreases, the collector currents dispersed in each of the bonding wires are concentrated so that a voltage drop due to a resistance component of the bonding wires and joining parts thereof increases. With the method of this embodiment, it is possible to measure such a minute difference in voltage drop. Furthermore, it is possible to detect the progress of deterioration due to the occurrence of the disconnection failure of the bonding wire described above using this.

Figure 9A:
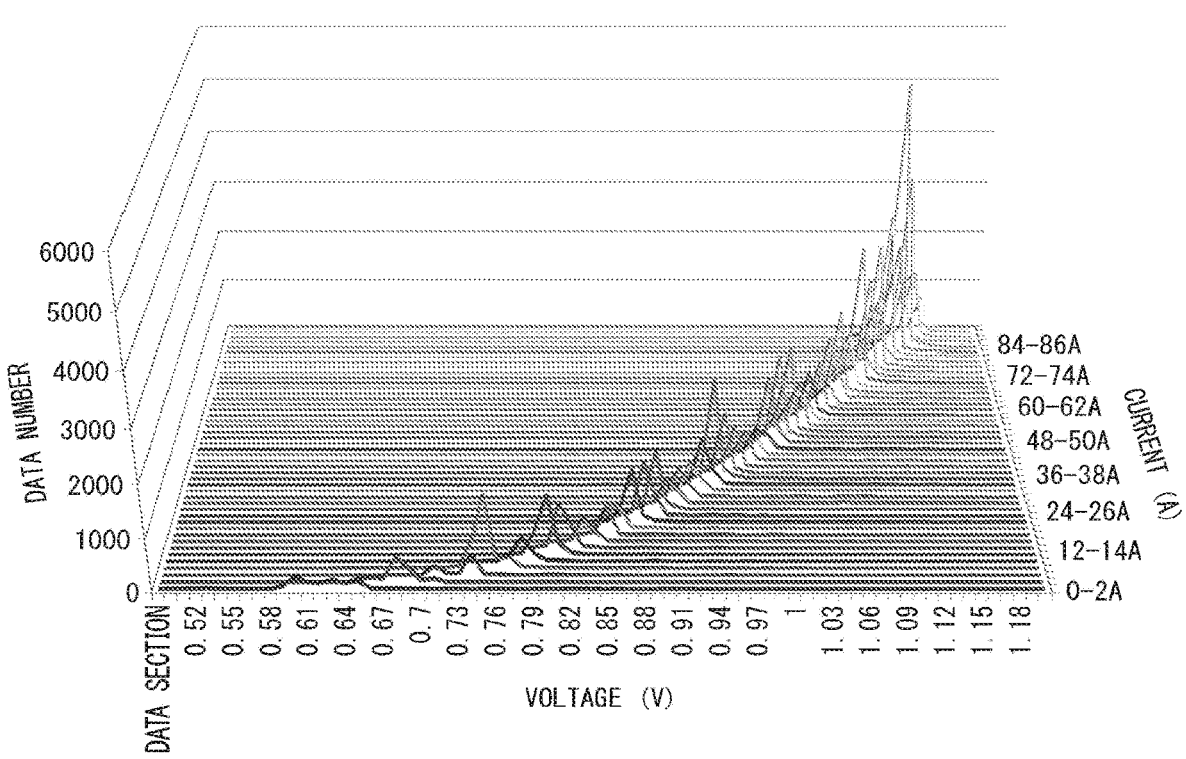
FIG. 9A is a diagram for explaining a distribution of detection frequencies at points of the IGBT at which the saturation voltage characteristic is shown in a second embodiment.
Figure 9B:
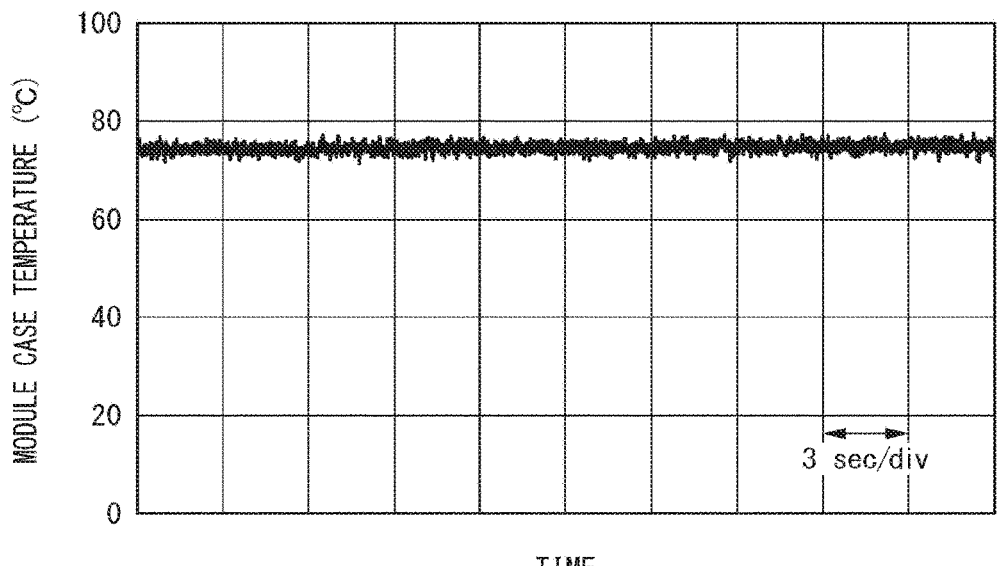
FIG. 9B is a diagram for explaining a detection result of a temperature of the IGBT during the measurement in FIG. 9A.

The saturation voltage characteristic of the IGBT and the temperature detection result when this embodiment is applied to another case different from the case shown in FIG. 6A will be described with reference to FIGS. 9A and 9B. FIG. 9A is a diagram for explaining a distribution of detection frequencies at points showing the saturation voltage characteristic of the IGBT 61 in the embodiment. FIG. 9B is a diagram for explaining the detection result of a temperature of the IGBT 61 during the measurement in FIG. 9A.

A point having a larger number of frequencies of a histogram illustrated in FIG. 9A corresponds to a point having a high frequency of saturation voltage detection. If points having a large number of frequencies are connected, a curve with the same tendency as the V-I characteristic diagram described above can be confirmed. As illustrated in FIG. 9B, although a fluctuation range of the temperature of the IGBT 61 during measurement is confirmed, the temperature is stable. Thus, an influence of a difference in temperature on the measurement result of the saturation voltage characteristic of the IGBT in FIG. 9A can be ignored.

Figure 10A:
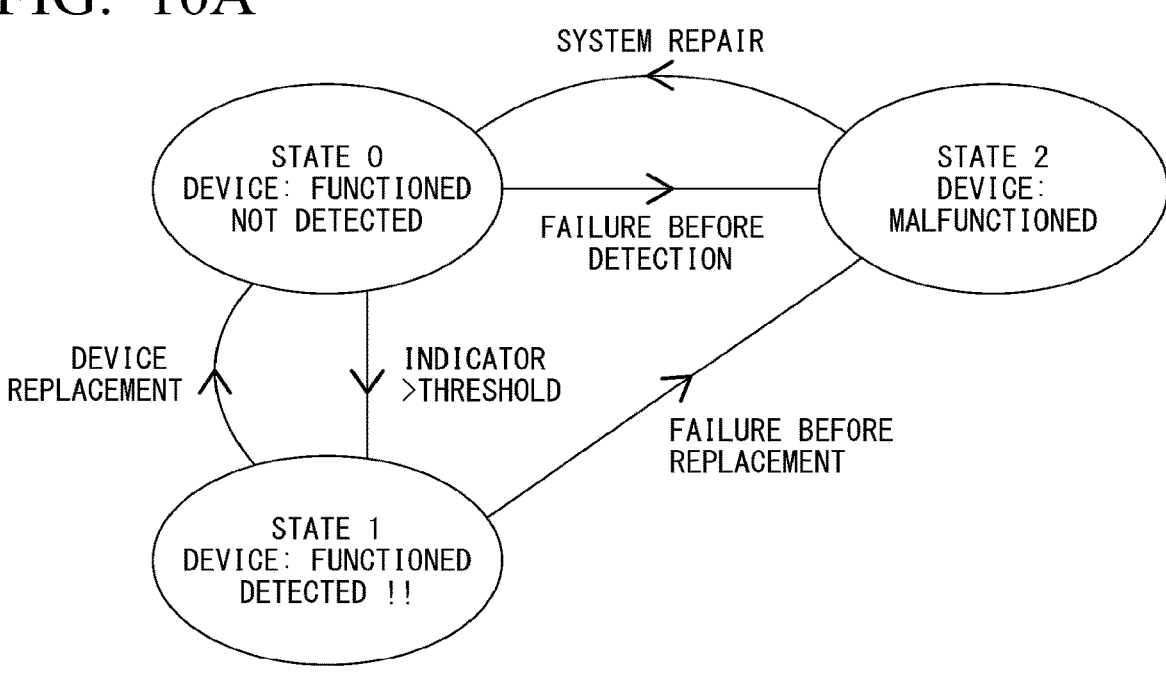
FIG. 10A is a diagram illustrating a state transition of the IGBT in the first embodiment.
Figure 10B:
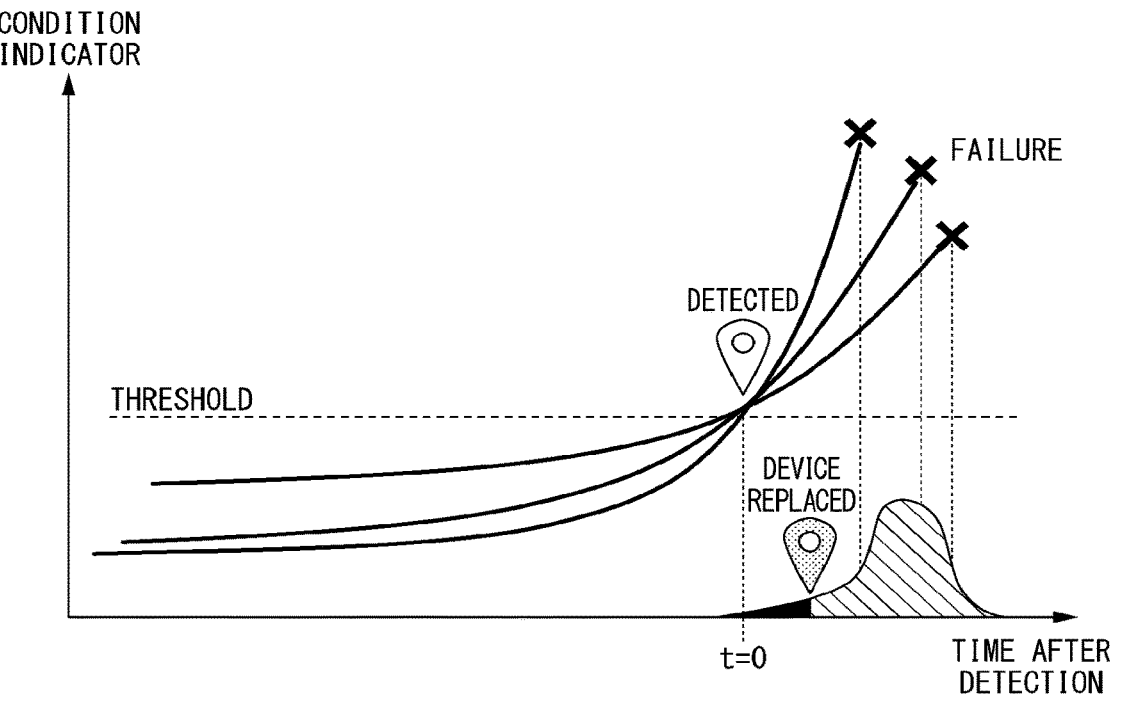
FIG. 10B is a diagram for explaining a relationship between a change in state of the IGBT in the first embodiment and a frequency of occurrence of accidental failures.

The prevention of an accidental failure of the IGBT will be described with reference to FIGS. 10A and 10B. FIG. 10A is a diagram illustrating a state transition of the IGBT 61 in the embodiment. FIG. 10B is a diagram for explaining a relationship between a change in state of the IGBT 61 in the embodiment and a frequency of occurrence of accidental failures.

As illustrated in FIG. 10A, the state of the IGBT 61 is roughly classified into three states. State 0 indicates a state in which the IGBT 61 is functioning and no event leading to an accidental failure has been detected. State 1 indicates a state in which, although the IGBT 61 is functioning, an event leading to an accidental failure has been detected. State 2 indicates a failure state in which the IGBT 61 does not function. System maintenance is required for restoring a state from State 2 to State 0.

In the case of the comparative example, since State 1 is not defined, a transition from State 0 to State 2 occurs due to the occurrence of the accidental failure of the IGBT 61. In this case, the transition from State 0 to State 2 itself cannot be controlled and the system is maintained and restored after the accidental failure occurs.

On the other hand, in this embodiment, it is detected that an event leading to an accidental failure has occurred before the accidental failure occurs. In this embodiment, in order to realize this, it is proposed to add a state (State 1) in which an event leading to an accidental failure occurs to the above transition. When a state is determined to be in State 1, the state can return to State 0 through, for example responding such as replacement of the target IGBT 61. Thus, the availability of the system can be improved as compared with the operation method in which the system is maintained after the failure occurs as in the comparative example.

An example of a determination method associated with the transition from State 0 to State 1 will be described below with reference to FIG. 10B.

If the IGBT 61 continuously operates, as illustrated in FIG. 10B, an index value indicating a state of the IGBT 61 tends to increase a rate of increase of the index value if the index value passes a certain value. A point in which the accidental failure actually occurred is indicated using a mark "X."

Times at which the index value described above passes a certain value are aligned, used as starting points of a time axis, and the probability of the occurrence of accidental failure is provided as a diagram illustrating a distribution through statistical processing on the basis of information concerning a period until an accidental failure occurs.

Due to the tendency illustrated in this diagram illustrating a distribution, preventive measures can be taken before the accidental failure occurs by replacing the target IGBT 61 before an occurrence rate of an accidental failure increases.

For example, the above method may be applied to the determination process using the estimation processing unit 467. The estimation processing unit 467 determines the above certain value using a threshold value TH. A value of the threshold value TH may be a predetermined value associated with a temperature or may be corrected in accordance with the temperature. When correction is performed in accordance with the temperature, the correction may be performed using an approximate expression in which a temperature deviation from a reference temperature is used.

As a result, it is possible to detect that the IGBT 61 determined to be in State 1 has occurred.

According to the above embodiment, the analysis processing unit 465 projects points indicating a combination of a voltage detection value in the first time history data and a current detection value in the second time history data onto the V-I coordinate plane (the coordinate plane including the voltage axis and the current axis) and derives a distribution of the points projected on the coordinate plane in the IGBT 61 having the pair of main terminals on the basis of the first time history data of voltages between the pair of main terminals detected when the pair of main terminals of the IGBT 61 is forward-biased and when the pair of main terminals are reverse-biased and the second time history data of detection values of both a forward current and a reverse current between the pair of main terminals. The estimation processing unit 467 estimates a state of the IGBT 61 on the basis of the distribution of the projected points. Thus, the state estimation system 1 can analyze a state associated with the progress of deterioration of the power conversion semiconductor apparatus within a period in which electric power is converted.

The voltage detection circuit 11 may receive electric power supplied from a DC power supply configured to supply DC power to the gate driver 63 using, as a reference potential, a reference potential of the gate driver 63 (a drive circuit) configured to supply a control signal to the gate terminal of the IGBT 61.

Second Embodiment

A second embodiment will be described by way of exemplifying the case of a power conversion system 1A in which a relatively large amount of electric power is converted. In the above case, it may be difficult to use an output signal of a current sensor 8 in a circuit provided on an IGBT 61 side by ensuring a withstand voltage in some cases. In this embodiment, a state estimation system 1A appropriate for such a case will be described.

Figure 11A:
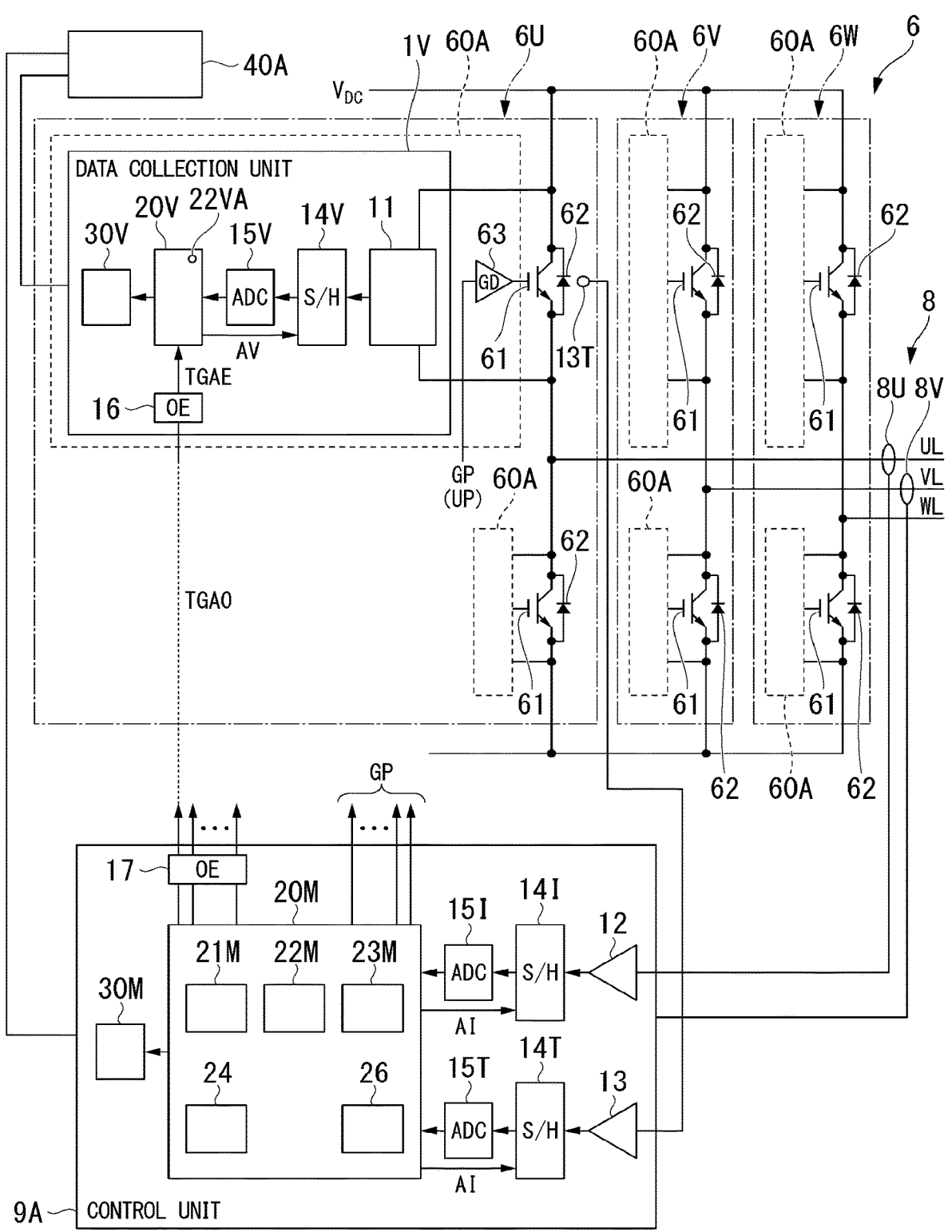
FIG. 11A is a diagram illustrating a constitution of a power conversion system to which a state estimation system in a second embodiment is applied.
Figure 11B:
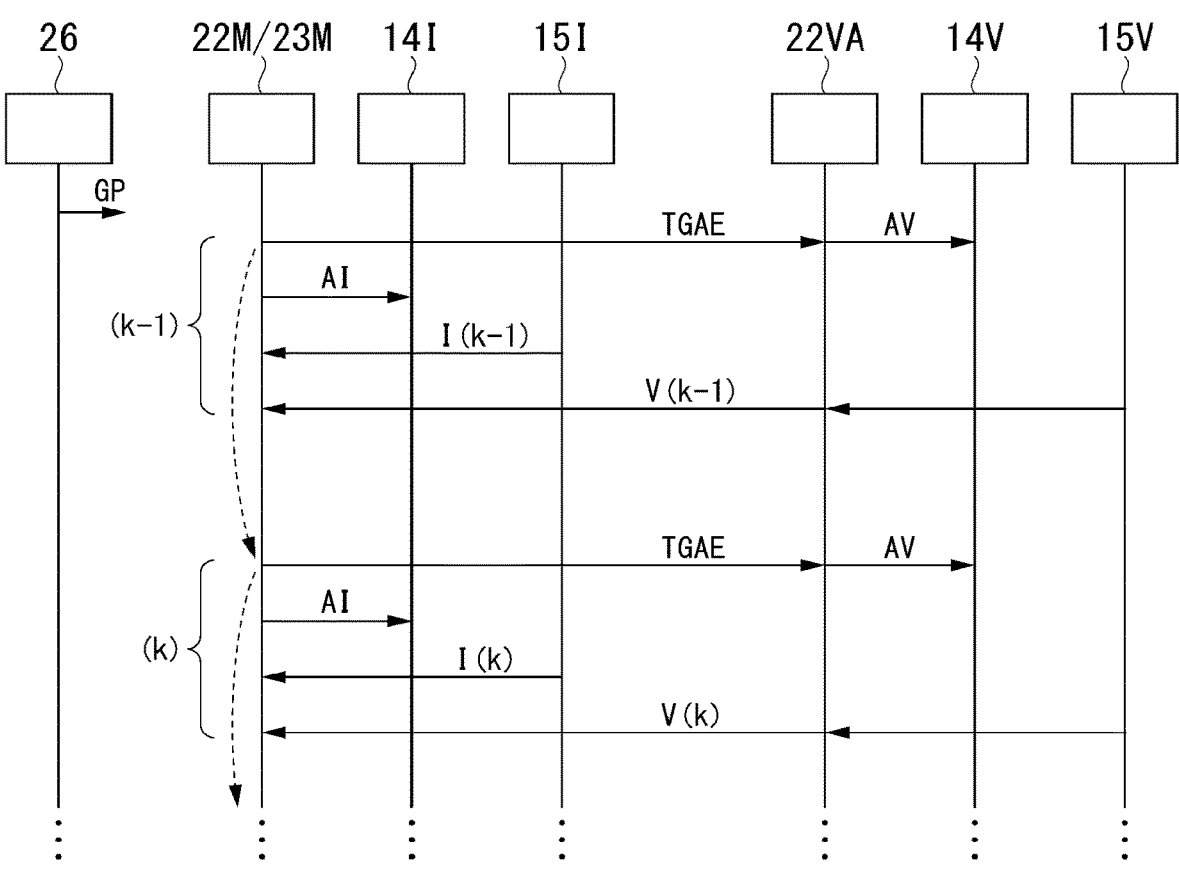
FIG. 11B is a diagram for explaining a process for collecting data using the state estimation system in FIG. 11A.

FIG. 11A is a diagram illustrating a constitution of a power conversion system 2 to which the state estimation system 1A in the second embodiment is applied. FIG. 11B is a diagram for explaining a process for collecting data using the state estimation system 1A in FIG. 11A.

The power conversion system 2 and that of the first embodiment differ as follows.

The power conversion system 2 includes a control unit 9A used instead of the control unit 9. Gate drive circuit units 60A formed independently are provided in each IGBT 61 forming an inverter 6 which is a main circuit, instead of the gate drive circuit unit 60. A data collection unit 1V which will be described later is provided in each of the gate drive circuit units 60A, instead of the data collection unit 1S of the gate drive circuit unit 60.

The state estimation system 1A and the above-described state estimation system 1 mainly differ in view of a constitution associated with a data collection technique. This point will be mainly described below.

The state estimation system 1A includes a data collection unit 1V, a control unit 9A, and an analysis processing apparatus 40A.

FIG. 11A illustrates a diagram illustrating the details of the data collection unit 1V. The data collection unit 1V includes, for example, a voltage detection circuit 11, a voltage value SH circuit 14V, an AD conversion circuit 15V, an OE circuit 16, a controller 20V, and a storage unit 30V.

Unlike the data collection unit 1S, the data collection unit 1V does not include a current detection circuit 12, a temperature detection circuit 13, a current value SH circuit 14I, a temperature detection value SH circuit 14T, and AD conversion circuits 15I and 15T. The current detection circuit 12, the temperature detection circuit 13, the current value SH circuit 14I, the temperature detection value SH circuit 14T, and the AD conversion circuits 15I and 15T are provided in the control unit 9A as will be described later. As described above, the data collection unit 1V is configured to detect a voltage and writes voltage data to the storage unit 30V.

The OE circuit 16 is connected to, for example, the control unit 9A which will be described later via an optical fiber. The OE circuit 16 receives a trigger signal TGAO supplied as an optical signal from the control unit 9A and generates a trigger signal AE which is an electric signal.

The controller 20V includes a synchronization control unit 22VA instead of the synchronization control unit 22 of the controller 20. The controller 20V (a sub-control unit) generates a first timing at which a voltage is detected using the synchronization control unit 22VA to convert an analog voltage value into first time history data. The details thereof will be described later.

The control unit 9A configured to control each data collection unit 1V will be described below.

The control unit 9A includes, for example, the current detection circuit 12, the temperature detection circuit 13, the current value SH circuit 14I, the temperature detection value SH circuit 14T, the AD conversion circuits 15I and 15T, an EO circuit 17, a controller 20M, and a storage unit 30M.

The controller 20M controls, for example, both of the inverter 6 and the state estimation system 1A.

A more specific example is illustrated. The controller 20M includes an inverter control unit 26, an AD conversion control unit 21M, a synchronization control unit 22M, a data storage processing unit 23M, and a communication processing unit 24.

The inverter control unit 26 controls the inverter 6. Known methods may be applied to this control.

The AD conversion control unit 21M controls the current value SH circuit 14I, the temperature detection value SH circuit 14T, and the AD conversion circuits 15I and 15T.

The synchronization control unit 22M generates an S/H trigger signal AI for synchronizing sampling of an electric current and a temperature and supplies the generated S/H trigger signal AI to the current value SH circuit 14I and the temperature detection value SH circuit 14T. Furthermore, the synchronization control unit 22M generates an S/H trigger signal AV which is an electric signal for synchronizing sampling of a voltage and supplies the generated S/H trigger signal AV to the EO circuit 17.

The controller 20M synchronizes a sampling timing of each signal using these signals. For example, the controller 20M (a main control unit) generates a second timing at which an electric current is detected to convert an analog current value into second time history data.

For example, with regard to sampling of a voltage, the EO circuit 17 converts the S/H trigger signal AV which is an electric signal into an optical signal and outputs a trigger signal TGAO. The OE circuit 16 converts the S/H trigger signal AV which is an optical signal into an electric signal TGAE and outputs the converted electric signal TGAE to the synchronization control unit 22VA.

The synchronization control unit 22VA receives a trigger signal AE output by the OE circuit 16 and generates an S/H trigger signal AV for ensuring the synchronization of signal conversion. The synchronization control unit 22VA sends the S/H trigger signal AV to the voltage value SH circuit 14V of the data collection unit 1V and samples the saturation voltage Vce (sat) of the IGBT 61 using the voltage value SH circuit 14V. After that, the AD conversion circuit 15V converts a signal sampled using the voltage value SH circuit 14V into a digital signal. The controller 20V collects a digital signal which has been converted by the AD conversion circuit 15V and writes the collected digital signal to the storage unit 30V to add it.

The current detection circuit 12, the temperature detection circuit 13, the current value SH circuit 14I, the temperature detection value SH circuit 14T, and the AD conversion circuits 15I and 15T included in the state estimation system 1 are not provided in the data collection unit 1V of the state estimation system 1A, but instead, are provided in the control unit 9A which will be described later.

The data storage processing unit 23M adds data concerning a current and a temperature converted by the AD conversion circuits 15I and 15T to the storage unit 30M.

The analysis processing apparatus 40M collects data associated with a voltage from the data collection unit 1V and collects data associated with a current and a temperature from the control unit 9A. The processing for each data may be the same as the processing of the analysis processing apparatus 40.

As illustrated in FIG. 11B, after the inverter control unit 26 outputs the gate pulse GP, the state estimation system 1A repeatedly collects data in accordance with a time history asynchronously to the gate pulse GP. (k−1) and (k) in FIG. 11B are examples of identification information indicating a time history. The state estimation system 1A samples data at a timing generated by the synchronization control unit 22M asynchronously to the gate pulse GP and collects the data.

According to the above embodiment, the control unit 9A (the main control unit) supplies a gate pulse GP (a control pulse) and a trigger signal TGAO (a synchronous trigger signal) to the main circuit side. When the voltage detection circuit 11 detects a voltage between the pair of main terminals of the IGBT 61 on the basis of the supplied trigger signal TGAO, even when the voltage detection circuit 11 and the current detection circuit 12 are separately disposed on the main circuit side and the control unit 9A side, it is possible to analyze a state associated with the progress of deterioration of the IGBT 61 within a period in which electric power is converted without being affected by such a disposition.

The current detection circuit 12 is configured to have the electrically same potential as the control unit 9A (the main control unit) and can be configured to output a signal having the reference potential of the control unit 9A as a reference potential.

Third Embodiment

A third embodiment will be described. A case exemplified in this third embodiment is also applicable to a power conversion system configured to convert a relatively large amount of electric power, as in the second embodiment described above.

Figure 12A:
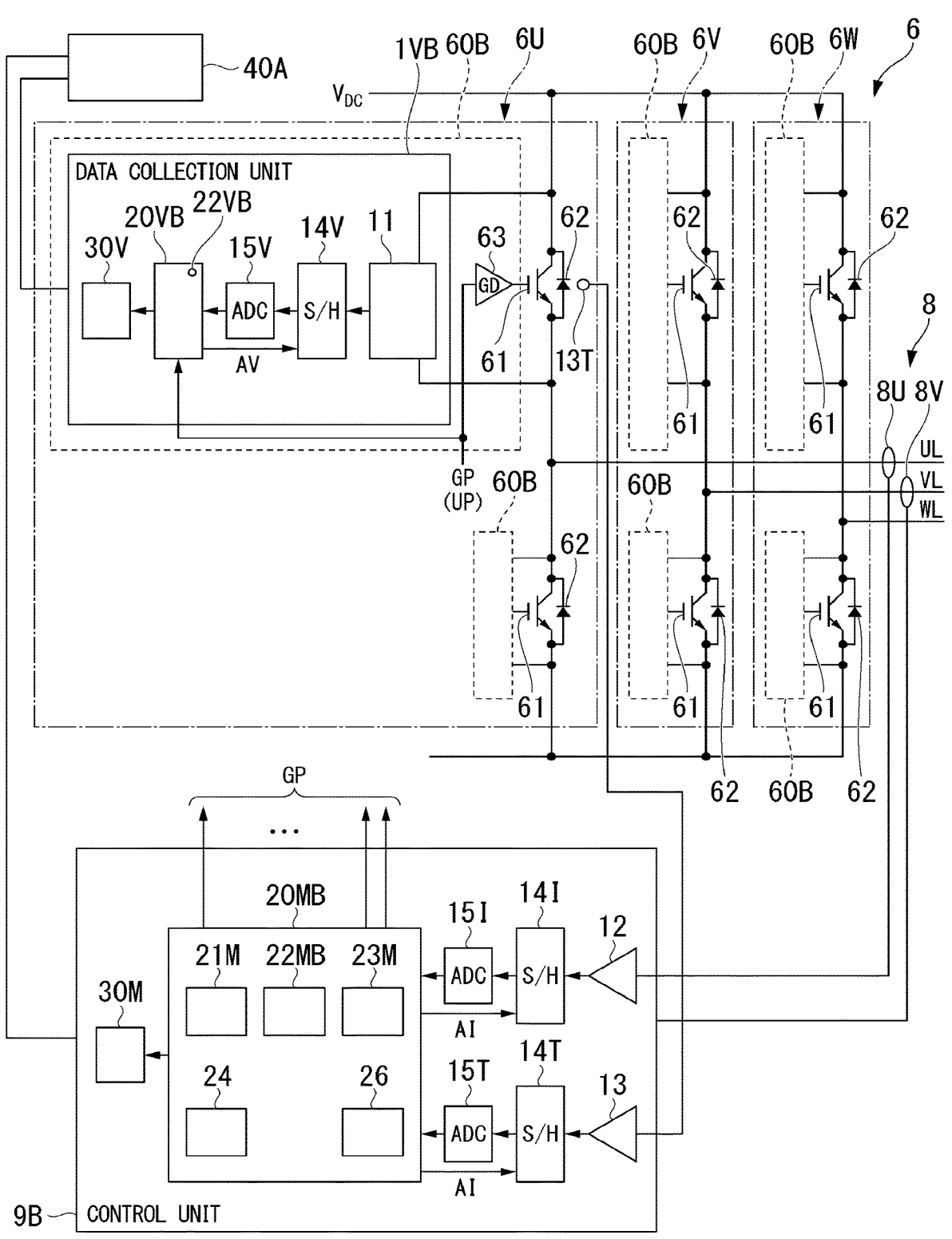
FIG. 12A is a diagram illustrating a constitution of a power conversion system to which a state estimation system in a third embodiment is applied.
Figure 12B:
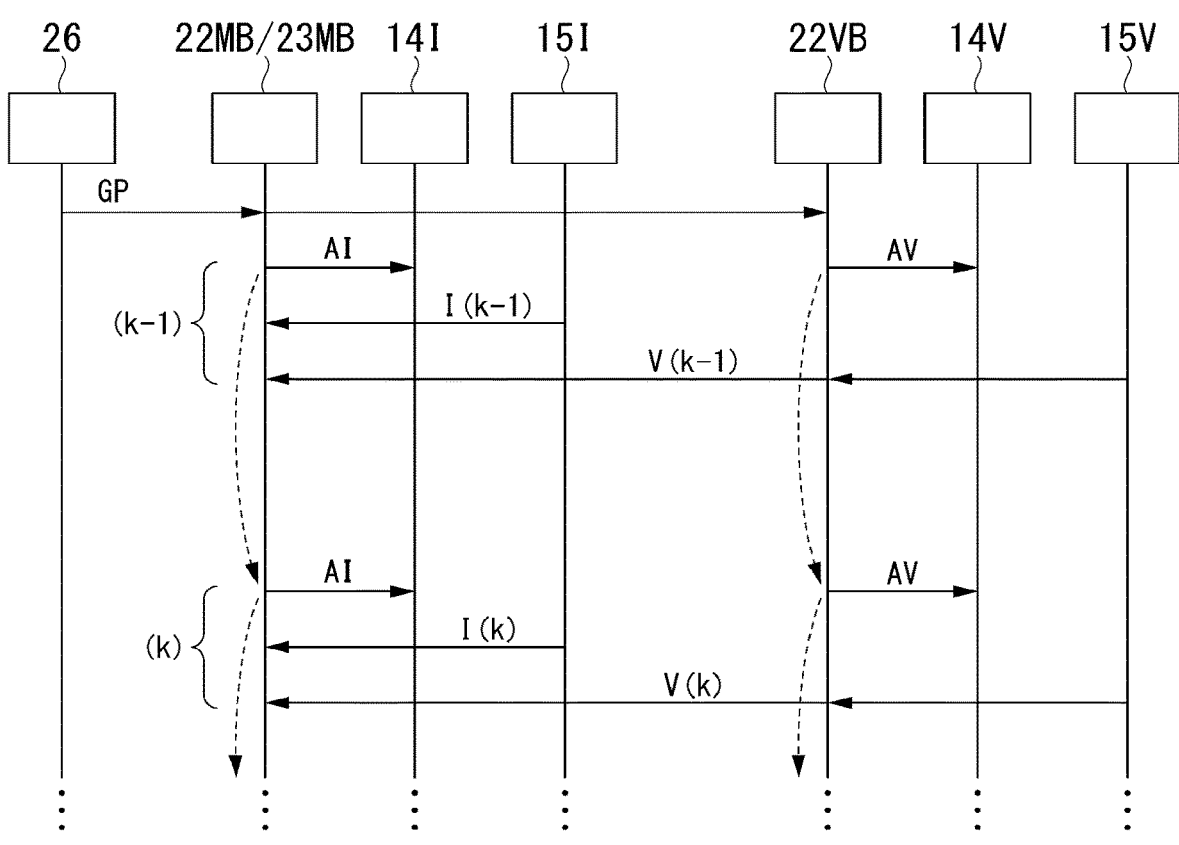
FIG. 12B is a diagram for explaining a process for collecting data using the state estimation system in FIG. 12A.

FIG. 12A is a diagram illustrating a constitution of a power conversion system 2 to which a state estimation system 1B in the third embodiment is applied. FIG. 12B is a diagram for explaining a process for collecting data using the state estimation system 1B in FIG. 12A.

The case of the third embodiment and the case of the second embodiment differ in that, in the case of the third embodiment, a control unit 9B (a main control unit) supplies a gate pulse GP (a control pulse) to a main circuit side, but does not supply a trigger signal to the main circuit side. This point will be mainly described below.

The power conversion system 2 in this embodiment and that in the second embodiment differ as follows.

The power conversion system 2 includes the control unit 9B instead of the control unit 9A. An independently formed gate drive circuit unit 60B is provided in each IGBT 61 forming an inverter 6 instead of the gate drive circuit unit 60A. Each data collection unit 1VB which will be described later is provided in the gate drive circuit unit 60B instead of the data collection unit 1V.

The state estimation system 1B and the above-described state estimation system 1A mainly differ in view of a constitution associated with a data collection technique. This point will be mainly described below.

The state estimation system 1B includes the data collection unit 1VB, the control unit 9B, and an analysis processing apparatus 40A.

FIG. 12A illustrates a detailed view of the data collection unit 1VB. The data collection unit 1VB includes, for example, a voltage detection circuit 11, a voltage value SH circuit 14V, an AD conversion circuit 15V, a controller 20VB, and a storage unit 30V.

The controller 20VB includes a synchronization control unit 22VB instead of the synchronization control unit 22VA. The details will be described later.

The control unit 9B includes a controller 20 MB instead of the controller 20MA of the control unit 9A.

The controller 20 MB controls, for example, both of the inverter 6 and the state estimation system 1B.

A more specific example is described. The controller 20 MB includes a synchronization control unit 22 MB and a data storage processing unit 23 MB instead of the synchronization control unit 22M of the controller 20MA and the data storage processing unit 23M.

An inverter control unit 26 outputs a gate pulse GP for controlling the inverter 6. This gate pulse GP is used not only for controlling the inverter 6 but also for synchronizing the sampling of data in the state estimation system 1B.

The synchronization control unit 22 MB generates an S/H trigger signal AI for synchronizing the sampling of a current and a temperature to synchronize with the gate pulse GP and supplies the generated S/H trigger signal AI to a current value SH circuit 14I and a temperature detection value SH circuit 14T. For example, a timer may be initialized at the time of rising of the gate pulse GP and then an S/H trigger signal AI for performing sampling may be generated at a prescribed interval in a prescribed period until a timing reaches a timing at which the next gate pulse GP is generated.

Also, the data collection unit 1VB side receives the gate pulse GP described above and the synchronization control unit 22VB generates an S/H trigger signal AV in the same manner as the synchronization control unit 22 MB described above. Thus, the controller 20 MB and the controller 20VB can synchronize a sampling timing of each signal using a common gate pulse GP.

For example, the synchronization control unit 22VB sends the S/H trigger signal AV to the voltage value SH circuit 14V of the data collection unit 1VB and samples a saturation voltage Vce (sat) of the IGBT 61 using the voltage value SH circuit 14V. After that, the AD conversion circuit 15V converts a signal sampled using the voltage value SH circuit 14V into a digital signal. The controller 20VB collects the digital signal which has been converted using the AD conversion circuit 15V and writes the digital signal to the storage unit 30V to add it.

The analysis processing apparatus 40M collects data associated with a voltage from the data collection unit 1VB and collects data associated with a current and a temperature from the control unit 9B. The processing for each data may be the same as the processing of the analysis processing apparatus 40.

According to the above embodiment, the control unit 9B (the main control unit) supplies the gate pulse GP (a control pulse) to the main circuit side. The voltage detection circuit 11 may generate an S/H trigger signal AV on the basis of the supplied gate pulse GP and detect a voltage between the pair of main terminals of the IGBT 61 in synchronization with the S/H trigger signal AV. Thus, even when the voltage detection circuit 11 and the current detection circuit 12 are separately disposed on the main circuit side and the control unit 9B side, it is possible to analyze a state associated with the progress of deterioration of the IGBT 61 within a period in which electric power is converted without being affected by such a disposition.

This third embodiment can also be applied to an existing power conversion system. In this case, it is possible to relatively reduce the modification of the existing power conversion system and it is possible to detect the progress of deterioration of the power conversion semiconductor apparatus by adding the state estimation system 1B configured to perform diagnosis using the gate pulse GP.

According to at least one of the embodiments described above, the state estimation system of the power conversion semiconductor apparatus includes the analysis processing unit and the estimation processing unit. The analysis processing unit projects points indicating a combination of a voltage detection value in first time history data of a voltage between the pair of main terminals detected when the pair of main terminals are forward-biased and when the pair of main terminals are reverse-biased and a current detection value in second time history data of detection values of both a forward current and a reverse current between the pair of main terminals onto a coordinate plane including a voltage axis and a current axis on the basis of the first time history data and the second time history data in the power conversion semiconductor apparatus including the pair of main terminals and derives a distribution of the projected points on the coordinate plane. The estimation processing unit estimates a state of the power conversion semiconductor apparatus on the basis of the distribution of the projected points. Thus, the state estimation system can analyze a state associated with the progress of deterioration of the power conversion semiconductor apparatus within a period in which electric power is converted.

Although some embodiments of the present invention have been described, these embodiments are presented as examples and are not intended to limit the scope of the present invention. These embodiments can be implemented in various other forms and various omissions, replacements, and changes are possible without departing from the gist of the present invention. These embodiments and the modifications thereof are included in the scope and the gist of the present invention as well as in the scope of the present invention described in the claims and the equivalent scope thereof.

A carrier frequency of PWM control may be fixed to a specific frequency or may be configured to fluctuate in accordance with a prescribed rule. In a case in which the carrier frequency of PWM control is configured to fluctuate in accordance with a prescribed rule, the analysis process and the estimation process for estimating a state associated with the progress of deterioration of the IGBT 61 may be performed during a period in which the carrier frequency is at a specific frequency or in association with the fact that the carrier frequency is at a specific frequency.

For example, it is defined that data for performing the analysis process and the estimation process is sampled when a carrier frequency CARF of PWM control is a prescribed frequency CARF0. The control unit 9B switches the carrier frequency CARE of PWM control to a prescribed frequency CARF0 and generates a gate pulse GP. The synchronization control unit 22VB of the data collection unit 1VB which has received this gate pulse GP may reproduce the carrier frequency CARF of PWM control from a pulse train of the gate pulse GP and, when it is detected that this frequency is the frequency CARF0, may start the sampling of a voltage between the pair of main terminals described above by regarding such a detection result as a trigger signal from the control unit 9B. When such methods are combined, it is possible to designate a period in which the carrier frequency CARF is a specific frequency CARF0 and analyze a state associated with the progress of deterioration of the power conversion semiconductor apparatus.

REFERENCE SIGNS LIST 1, 1A, 1B State estimation system
1S, 1V, 1VB Data collection unit
2 Power conversion system
G AC power supply
M Electric motor
3 Transformer
4 Converter
5 Capacitor
6 Inverter
8 Current sensor
9, 9A, 9B Control unit
11 Voltage detection circuit
12 Current detection circuit
13 Temperature detection circuit
14 SH circuit
15 AD conversion circuit
465 Analysis processing unit
467 Estimation processing unit

The invention claimed is:

1. A state estimation system for a power conversion semiconductor apparatus, comprising:

an analysis processing unit configured to project points indicating a combination of a voltage detection value in first time history data of a voltage between a pair of main terminals detected when the pair of main terminals are forward-biased by a constant current source and when the pair of main terminals are reverse-biased by the constant current source and a current detection value in second time history data of detection values of both a forward current and a reverse current between the pair of main terminals onto a coordinate plane including a voltage axis and a current axis on the basis of the first time history data and the second time history data regarding a semiconductor device including the pair of main terminals and derive a distribution of the projected points on the coordinate plane; and an estimation processing unit configured to estimate a state of the semiconductor device in an operating state of switching on the basis of a distribution of the projected points, wherein the semiconductor device including a switching device and a freewheeling diode connected in antiparallel to the switching device, the constant current source includes a pair of current sources, one of the pair of current sources connects to the 1st terminal of the switching device via 1st diode, and another of the pair of current sources connects to the 2nd terminal of the switching device via 2nd diode.

2. The state estimation system for a power conversion semiconductor apparatus according to claim 1, comprising:

a first data collection unit configured to collect the first time history data as first time series data indicating the voltage detection value; and a second data collection unit configured to collect the second time history data as second time series data indicating the current detection value.

3. The state estimation system for a power conversion semiconductor apparatus according to claim 2, comprising:

a data acquisition unit configured to acquire the first time series data and the second time series data and combine voltage value data in the first time series data and current value data in the second time series data using, as a key, a time history identifier which is able to identify when the voltage and the current have been detected.

4. The state estimation system for a power conversion semiconductor apparatus according to claim 1, wherein the estimation processing unit estimates the state of a freewheeling diode of the semiconductor device by detecting a change over time of a conduction characteristic of the freewheeling diode on the basis of the distribution of the projected points.

5. The state estimation system for a power conversion semiconductor apparatus according to claim 1, wherein the semiconductor device includes any of an IGBT in which the freewheeling diode is connected in antiparallel.

6. The state estimation system for a power conversion semiconductor apparatus according to claim 1, comprising:

a sub-control unit configured to generate a first timing at which the voltage used as the first time history data is detected; and a main control unit configured to generate a second timing at which the current used as the second time history data is detected.

7. The state estimation system for a power conversion semiconductor apparatus according to claim 1, comprising:

a voltage detection circuit formed so that the voltage applied between the pair of main terminals of the power conversion semiconductor apparatus is able to be detected during power conversion operation using the power conversion semiconductor apparatus.

8. The state estimation system for a power conversion semiconductor apparatus according to claim 7, wherein the voltage detection circuit receives electric power supplied from a direct current (DC) power supply configured to supply DC power to a drive circuit configured to supply a control signal to a control terminal of the power conversion semiconductor apparatus using, as a reference potential, a reference potential of the drive circuit.

9. The state estimation system for a power conversion semiconductor apparatus according to claim 7, wherein the voltage detection circuit includes:

a differential amplifier configured to differentially detect a potential difference between the main terminals;

a pair of insulating diodes having a desired dielectric strength characteristic, provided between the pair of main terminals and each input of the differential amplifier, and configured to perform insulating so that an excessive voltage of the pair of main terminals is not applied to each input of the differential amplifier; and a bias circuit configured to allow a bias current to flow through each of the pair of main terminals via the pair of insulating diodes, and the differential amplifier outputs a signal associated with a potential difference between the main terminals when both of the pair of insulating diodes are turned on.

10. The state estimation system for a power conversion semiconductor apparatus according to claim 9, comprising:

a clamp circuit configured to limit an upper limit of a voltage of each input of the differential amplifier to a positive limiting voltage, wherein the positive limiting voltage is a voltage lower than a positive allowable input voltage of the differential amplifier and is set to exceed a measurement range of a voltage of the pair of main terminals.

11. The state estimation system for a power conversion semiconductor apparatus according to claim 9, comprising:

a clamp circuit configured to limit a lower limit of a voltage of each input of the differential amplifier to a negative limiting voltage, wherein the negative limiting voltage is a voltage higher than a negative allowable input voltage of the differential amplifier and is set to exceed a measurement range of a voltage of the pair of main terminals.

12. The state estimation system for a power conversion semiconductor apparatus according to claim 7, wherein the voltage detection circuit is provided for each power conversion semiconductor apparatus, is installed in a gate drive circuit unit of the power conversion semiconductor apparatus, and shares a DC power supply in the gate drive circuit unit.

13. The state estimation system for a power conversion semiconductor apparatus according to claim 7, comprising:

a current detection circuit configured to detect a value of a current flowing between the pair of main terminals.

14. The state estimation system for a power conversion semiconductor apparatus according to claim 13, wherein a power conversion apparatus including:

a main circuit including the power conversion semiconductor apparatus and formed to enable a regenerative operation; and a main control unit configured to generate a control pulse based on the detected current value and supply the control pulse to switch the power conversion semiconductor apparatus is used as an evaluation target.

15. The state estimation system for a power conversion semiconductor apparatus according to claim 14, wherein the current detection circuit outputs a signal having a reference potential of the main control unit as a reference potential.

16. The state estimation system for a power conversion semiconductor apparatus according to claim 15, wherein the main control unit supplies the control pulse to the main circuit side, and the voltage detection circuit generates a synchronous trigger signal on the basis of the supplied control pulse and detects the voltage between the pair of main terminals in synchronization with the synchronous trigger signal.

17. The state estimation system for a power conversion semiconductor apparatus according to claim 14, wherein the main control unit supplies the control pulse and a synchronous trigger signal to the main circuit side, and the voltage detection circuit detects the voltage between the pair of main terminals on the basis of the supplied synchronous trigger signal.

18. The state estimation system for a power conversion semiconductor apparatus according to claim 16, wherein a cycle of the control pulse is set longer than a cycle of the synchronous trigger signal.

19. The state estimation system for a power conversion semiconductor apparatus according to claim 1, wherein the analysis processing unit obtains a saturation voltage characteristic curve of the power conversion semiconductor apparatus using statistical processing based on a distribution of the projected points on the coordinate plane on the basis of the first time history data and the second time history data which are time history data of a period of one or a plurality of gate pulses of the power conversion semiconductor apparatus.

20. A state estimation method for a power conversion semiconductor apparatus including a pair of main terminals, using a computer for a state estimation system, comprising:

a step of projecting points indicating a combination of a voltage detection value in first time history data of a voltage between the pair of main terminals detected when the pair of main terminals are forward-biased by a constant current source and when the pair of main terminals are reverse-biased by the constant current source and a current detection value in second time history data of detection values of both a forward current and a reverse current between the pair of main terminals onto a coordinate plane including a voltage axis and a current axis on the basis of the first time history data and the second time history data regarding a semiconductor device including the pair of main terminals and deriving a distribution of the projected points on the coordinate plane, estimating a state of the semiconductor device on the basis of a distribution of the projected points, and estimating a state of the semiconductor device in an operating state of switching on the basis of a distribution of the projected points, wherein the semiconductor device including a switching device and a freewheeling diode connected in antiparallel to the switching device, the constant current source includes a pair of current sources, one of the pair of current sources connects to the 1st terminal of the switching device via 1st diode, and another of the pair of current sources connects to the 2nd terminal of the switching device via 2nd diode.

21. The state estimation method for a power conversion semiconductor apparatus according to claim 20, further comprising estimating the state of a freewheeling diode of the semiconductor device by detecting a change over time of a conduction characteristic of the freewheeling diode on the basis of the distribution of the projected points.

22. The state estimation method for a power conversion semiconductor apparatus according to claim 20, wherein the semiconductor device includes any of: an IGBT in which the freewheeling diode is connected in antiparallel.

* * * * *